(12) United States Patent
Yoneda et al.

(10) Patent No.: US 9,831,379 B2
(45) Date of Patent: Nov. 28, 2017

(54) METHOD OF MANUFACTURING LIGHT EMITTING DEVICE

(71) Applicant: Nichia Corporation, Anan-shi, Tokushima (JP)

(72) Inventors: Akinori Yoneda, Anan (JP); Yoshiyuki Aihara, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 61 days.

(21) Appl. No.: 14/838,255

(22) Filed: Aug. 27, 2015

(65) Prior Publication Data
US 2016/0064621 A1    Mar. 3, 2016

(30) Foreign Application Priority Data
Aug. 28, 2014   (JP) ................. 2014-174365

(51) Int. Cl.
*H01L 33/00*   (2010.01)
*H01L 33/50*   (2010.01)
*H01L 33/38*   (2010.01)

(52) U.S. Cl.
CPC ........ *H01L 33/0079* (2013.01); *H01L 33/382* (2013.01); *H01L 33/504* (2013.01);
(Continued)

(58) Field of Classification Search
CPC ........... H01L 2924/002; H01L 2924/00; H01L 33/0079; H01L 33/005; H01L 33/382;
(Continued)

(56) References Cited

U.S. PATENT DOCUMENTS

2008/0210955 A1    9/2008  Uemura et al.
2010/0140640 A1*   6/2010  Shimokawa ........ H01L 33/0079
                                                    257/98
(Continued)

FOREIGN PATENT DOCUMENTS

JP    2008-124411 A    5/2008
JP    2008-186959 A    8/2008
(Continued)

*Primary Examiner* — Sophia Nguyen
(74) *Attorney, Agent, or Firm* — Foley & Lardner LLP

(57) ABSTRACT

A method of manufacturing a light emitting device includes providing a wafer having a substrate and a plurality of semiconductor stacked-layer bodies stacked on the substrate, an upper surface of the substrate being exposed at an outer peripheral region of each of the plurality of semiconductor stack bodies in a plan view, forming a separation layer integrally covering the upper surface of the substrate and an upper surface of the semiconductor stacked-layer body, the separation layer including a separation boundary, forming a support member on the separation layer, removing the substrate, forming a wavelength conversion layer on a side of the semiconductor stack body and the separation layer where the substrate is removed, the wavelength conversion layer made of a resin containing a wavelength conversion member, and removing the wavelength conversion layer located in the outer peripheral region by separating the separation layer at the separation boundary.

20 Claims, 14 Drawing Sheets

(52) U.S. Cl.
CPC ............. *H01L 2933/0041* (2013.01); *H01L 2933/0066* (2013.01)

(58) Field of Classification Search
CPC ....... H01L 33/46; H01L 33/48; H01L 33/504; H01L 33/56; H01L 2933/0041; H01L 2933/0066
See application file for complete search history.

(56) References Cited

U.S. PATENT DOCUMENTS

| | | | | |
|---|---|---|---|---|
| 2011/0073889 | A1* | 3/2011 | Sugizaki | H01L 25/048 257/98 |
| 2011/0204396 | A1* | 8/2011 | Akimoto | H01L 33/385 257/98 |
| 2011/0297980 | A1* | 12/2011 | Sugizaki | H01L 33/38 257/98 |
| 2012/0273823 | A1* | 11/2012 | Yoneda | H01L 33/38 257/98 |
| 2013/0026518 | A1* | 1/2013 | Suh | H01L 33/44 257/98 |
| 2013/0146933 | A1* | 6/2013 | Unosawa | H01L 33/38 257/99 |
| 2013/0248915 | A1* | 9/2013 | Shimada | H01L 33/007 257/99 |
| 2013/0285091 | A1 | 10/2013 | Akimoto et al. | |
| 2013/0313589 | A1 | 11/2013 | Tomizawa et al. | |
| 2013/0313591 | A1* | 11/2013 | Shimada | H01L 33/486 257/98 |
| 2013/0313592 | A1* | 11/2013 | Sugizaki | H01L 25/167 257/98 |
| 2013/0320383 | A1* | 12/2013 | Izuka | H01L 33/38 257/98 |
| 2013/0334539 | A1* | 12/2013 | Kojima | H01L 33/44 257/76 |
| 2014/0227813 | A1* | 8/2014 | Yoneda | H01L 33/0095 438/33 |
| 2014/0252388 | A1* | 9/2014 | Kimura | H01L 33/502 257/98 |
| 2014/0319567 | A1* | 10/2014 | Yoneda | H01L 24/19 257/98 |
| 2015/0207042 | A1* | 7/2015 | Yoneda | H01L 33/52 257/98 |

FOREIGN PATENT DOCUMENTS

| | | |
|---|---|---|
| JP | 2008-205005 A | 9/2008 |
| JP | 2011-146674 A | 7/2011 |
| JP | 2011-258657 A | 12/2011 |
| JP | 2013-140942 A | 7/2013 |
| JP | 2013-232539 A | 11/2013 |
| JP | 2014-003283 A | 1/2014 |
| JP | 2014-179590 A | 9/2014 |

* cited by examiner

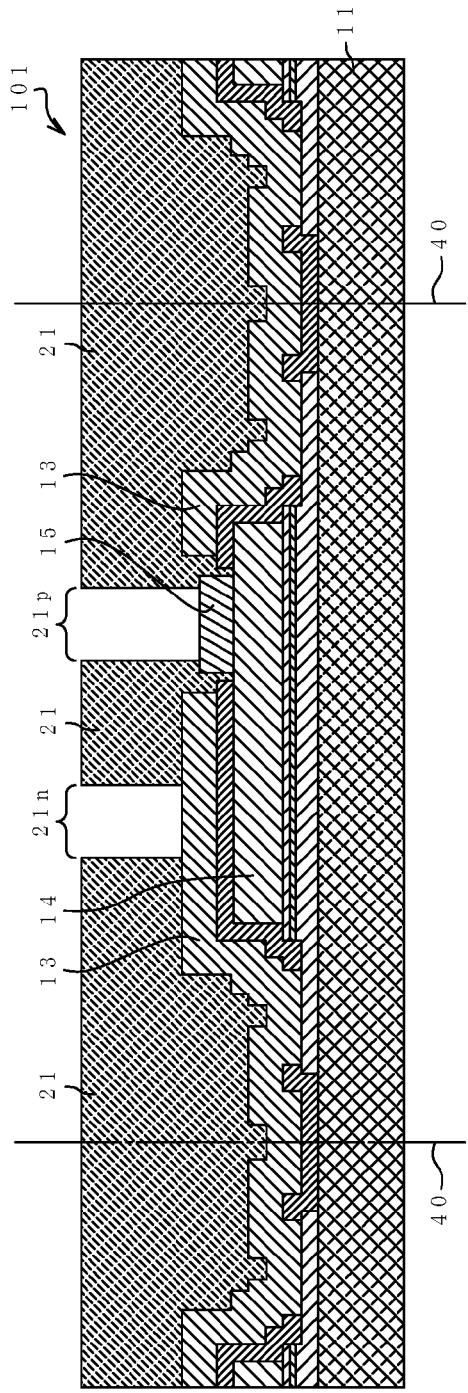

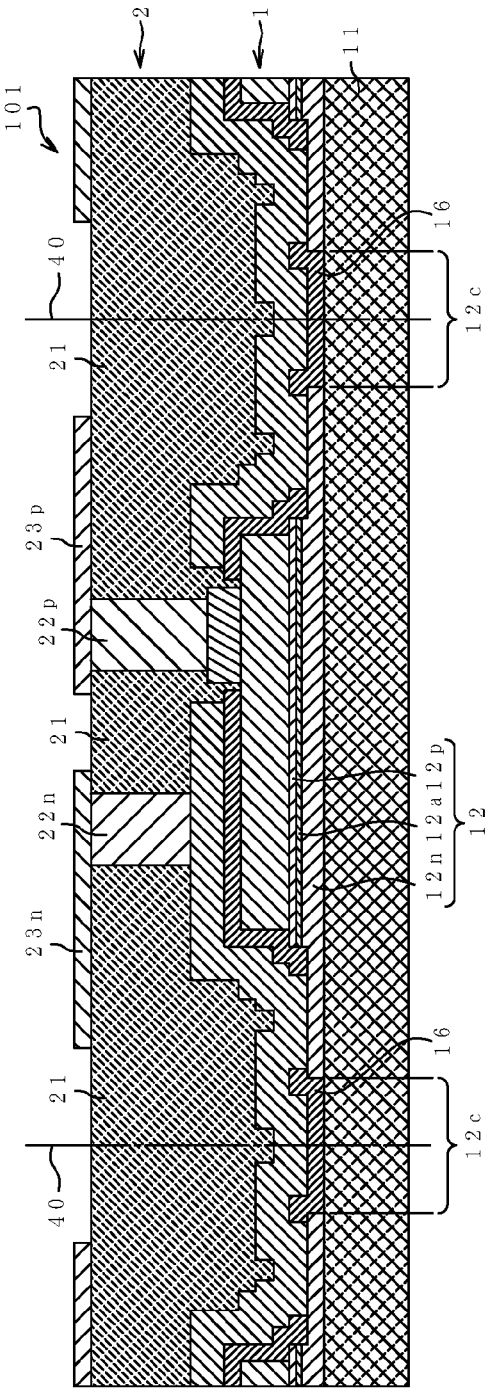
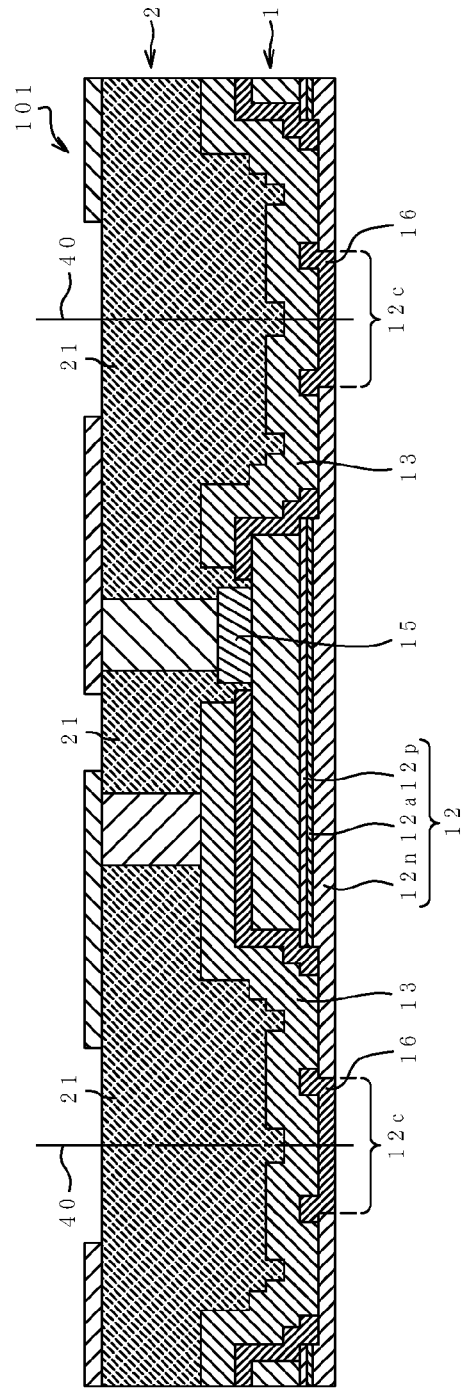
FIG. 8A
FIG. 8B

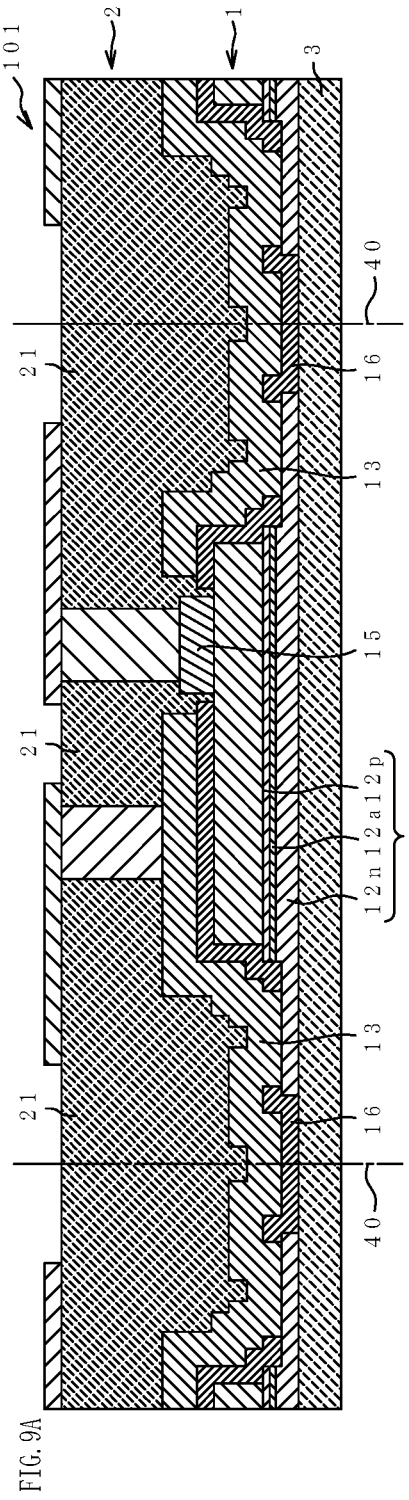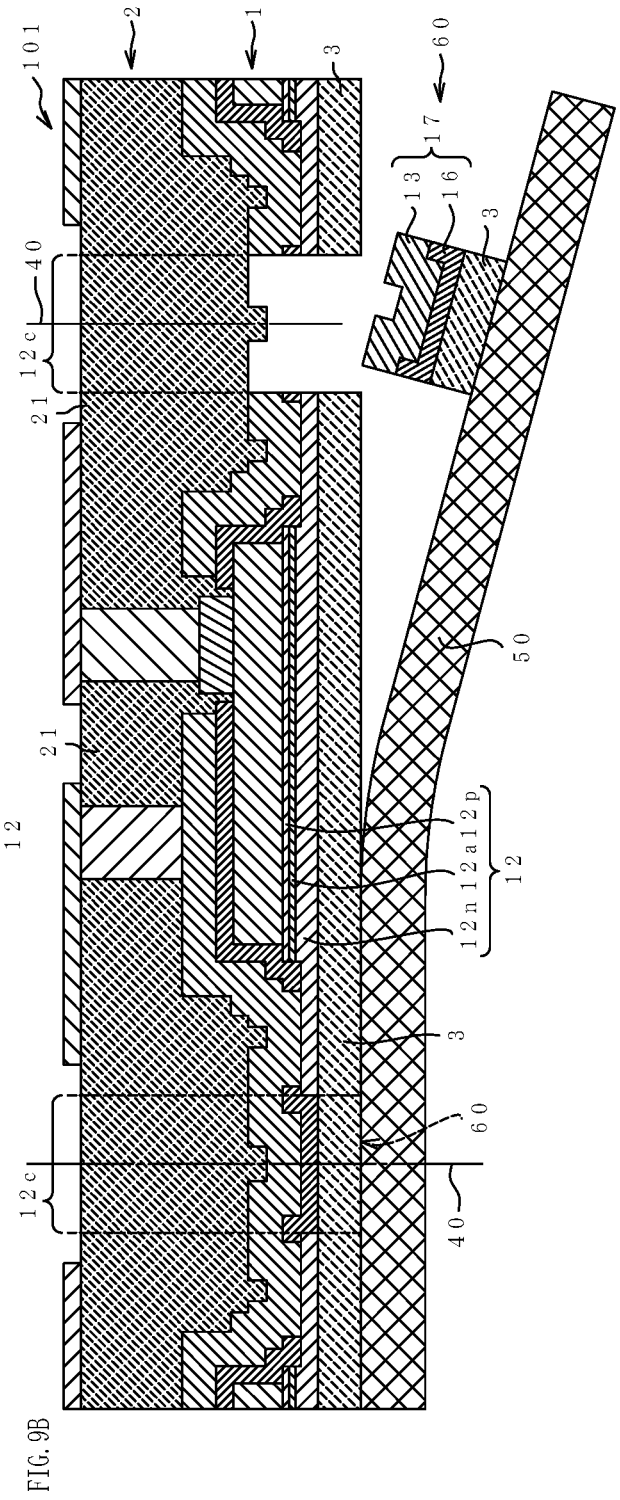
FIG. 9A
FIG. 9B

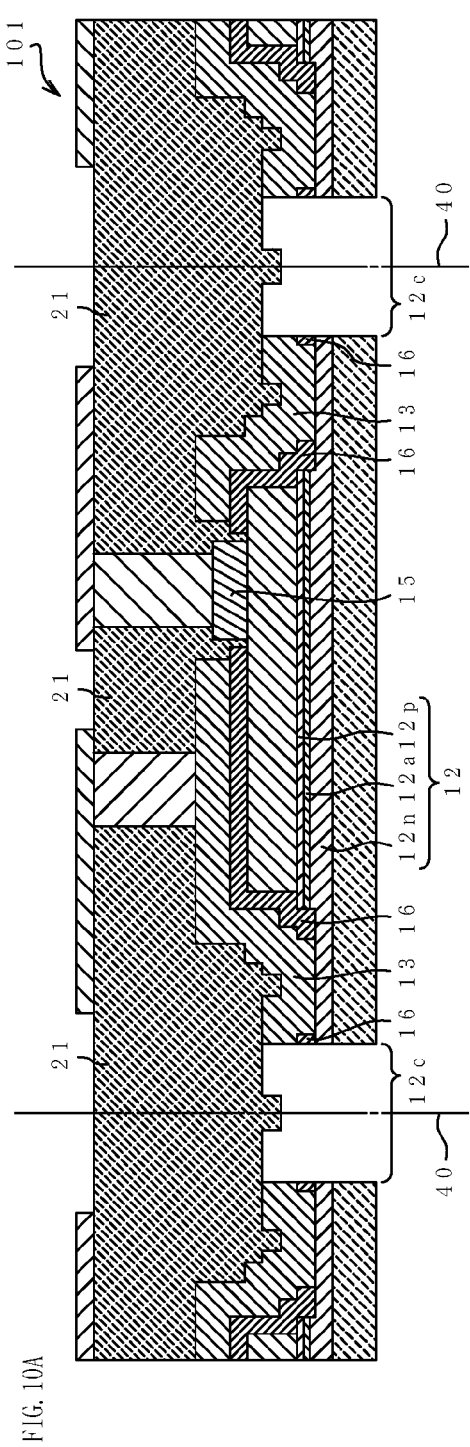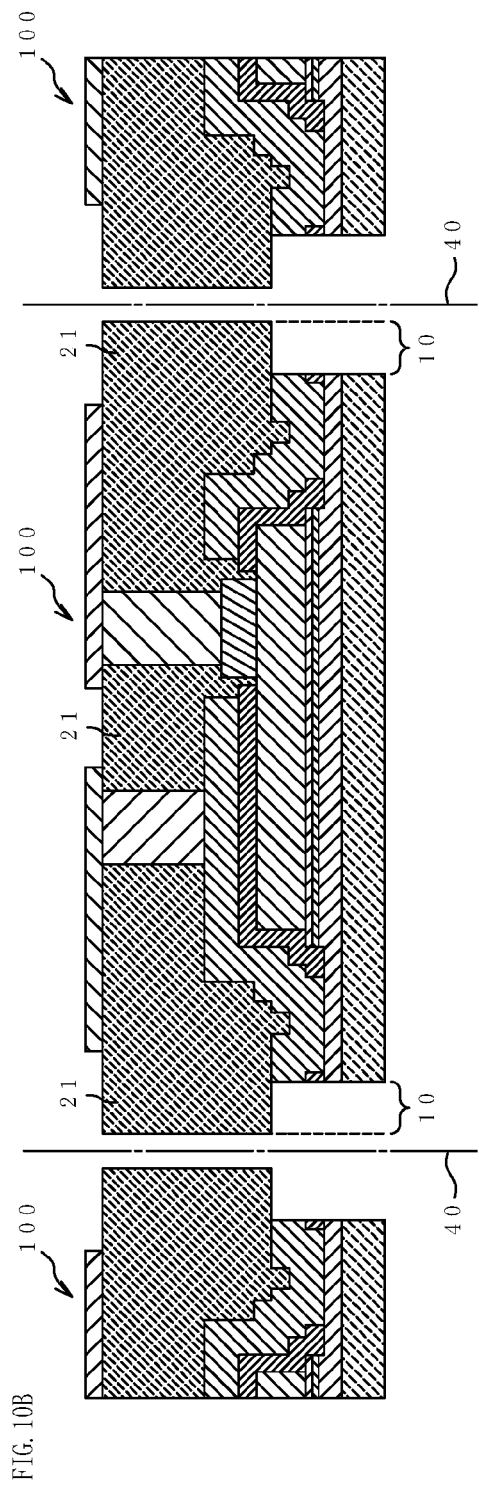
FIG. 10A
FIG. 10B

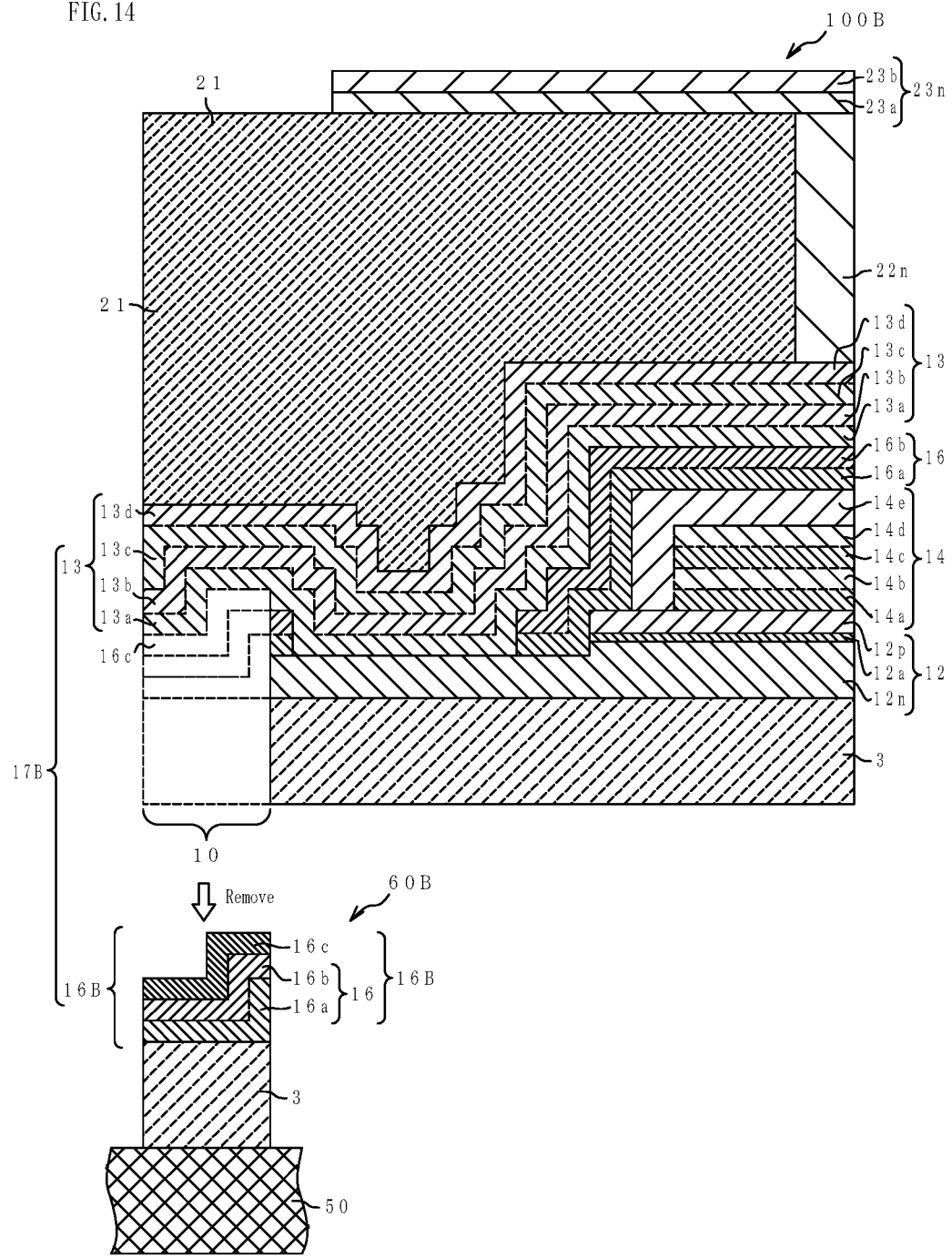

METHOD OF MANUFACTURING LIGHT EMITTING DEVICE

CROSS-REFERENCE TO RELATED PATENT APPLICATION

The present application claims priority to Japan Patent Application No. 2014-174365 filed Aug. 28, 2014, which is incorporated herein by reference in its entirety.

BACKGROUND

1. Technical Field

The present disclosure relates to a method of manufacturing a light emitting device that includes a semiconductor light emitting element and a wavelength conversion layer.

2. Description of the Related Art

Light emitting devices using a semiconductor light emitting element such as a light emitting diode are widely used because of their ease of miniaturization and high light emission efficiency. Light emitting devices using a semiconductor light emitting element are roughly divided into two types, namely, the face up type, in which a semiconductor light emitting element is provided with a pad electrode at a surface on a side opposite to the mounting substrate side, and the face down type, in which the light emitting element is provided with the pad electrode at a lower surface facing the mounting substrate.

With the face down type, the pad electrode provided on the surface of the semiconductor light emitting element and a wiring provided on the mounting substrate can be electrically connected to each other via a connecting member, such as bumps, metal pillars or the like, which are positioned in an area within the outer periphery of the semiconductor light emitting element in a plan view seen from a direction perpendicular to the surface of the mounting substrate. This realizes a chip size package or a chip scale package (CSP) in which the size of the light emitting device (particularly, the size in a plan view seen from a direction perpendicular to the mounting substrate) is reduced almost to the size of a chip of the light emitting element. In recent years, in order to achieve further miniaturization, or in order to further improve the light emission efficiency, face down type light emitting devices have been employed in which a growth substrate (a light-transmissive substrate), made of sapphire or the like, is removed or the thickness of the growth substrate is reduced.

The growth substrate is a substrate for growing thereon an n-type semiconductor layer and a p-type semiconductor layer, which structures the semiconductor light emitting element. The growth substrate also improves the strength of the light emitting device by supporting the semiconductor light emitting element, which has a small thickness and a low mechanical strength. Accordingly, the light emitting device in which the growth substrate is removed or the thickness of the growth substrate is reduced after forming the semiconductor light emitting element, for example, as disclosed in Japanese Patent Application No. JP 2011-258657 A, may be provided with a resin layer on the electrode side (the side opposing the mounting substrate). The resin layer supports the light emitting element. A metal pillar penetrates through the resin layer and electrically connects the electrode of the light emitting element and a wiring (a wiring layer) provided at the mounting substrate. With a resin layer containing a metal pillar, the light emitting device can reliably obtain sufficient mechanical strength.

Meanwhile, for example, JP 2011-258657 A discloses a light emitting device provided with a resin layer that contains a phosphor (a phosphor layer) on the back surface side of the semiconductor light emitting element, i.e., on the side opposite to the resin layer that serves as a base member. The light emitting device is configured such that a portion of light (e.g., a blue light) emitted by a semiconductor light emitting element is converted into a light of a different wavelength (e.g., a yellow light) by the phosphor contained in the resin layer, and the light of the converted wavelength and the light of the unconverted wavelength are mixed to produce a light of a different color (e.g., a white light).

In a light emitting device having such a structure as disclosed in JP 2011-258657 A, the resin layer that serves as a base member is preferably disposed to cover the semiconductor light emitting element in a plan view in order to protect the semiconductor light emitting element from mechanical shock or from the outside air. Also, in such a light emitting device, after the resin layer that serves as a base member is formed on the semiconductor layer side of the semiconductor light emitting element, the growth substrate is peeled off, and the phosphor layer is formed on the side opposite to the resin layer that serves as a base member. At this time, if the phosphor layer is disposed in a shape identical to the resin layer that serves as a base member in a plan view, the phosphor layer is extended to the outer peripheral region of the light emitting device, which is the region outside the semiconductor light emitting element in a plan view. With the phosphor layer extended to the outer peripheral region, emission from the outer peripheral region is mainly a yellow light emitted from the phosphor layer. Accordingly, the color of the light emitted from the light emitting device will have different hues between the region overlapping the semiconductor light emitting element and the outer peripheral region in a plan view. That is, the luminous intensity distribution characteristic of the light emitting device becomes inconsistent. Accordingly, from the viewpoint of the luminous intensity distribution characteristic, it is preferable not to provide the phosphor layer at the outer peripheral region.

JP 2011-258657 A discloses a method of forming the phosphor layer at a predetermined region using a nanoimprinting method or a molding method. Also, JP 2011-258657 A discloses the use of other methods for forming the phosphor layer, such as an inkjet printing method or a dispensing method. However, a nanoimprinting method or a molding method requires an expensive molding assembly. Further, an inkjet printing method and a dispensing method require the application of minute droplets to a predetermined region; thus, in addition to the high price of the application apparatus, high productivity is difficult to achieve.

SUMMARY

Accordingly, an object of certain embodiments of the present invention is to provide a method of manufacturing a CSP-type light emitting device that includes a wavelength conversion layer, which has a good luminous intensity distribution characteristic and can be easily manufactured with good productivity.

In order to achieve the object stated above, a method of manufacturing a light emitting device according to an embodiment of the present invention includes providing a wafer having a substrate and a plurality of semiconductor stacked-layer bodies stacked on the substrate, an upper surface of the substrate being exposed at an outer peripheral region of each of the plurality of semiconductor stacked-layer bodies in a plan view, and forming a separation layer integrally covering the upper surface of the substrate and an upper surface of the semiconductor stacked-layer body, the separation layer including a separation boundary. The method further includes forming a support member on the separation layer, removing the substrate, forming a wavelength conversion layer on a side of the semiconductor stacked-layer body and the separation layer where the substrate is removed, the wavelength conversion layer made of a resin containing a wavelength conversion member, and removing the wavelength conversion layer located in the outer peripheral region by separating the separation layer at the separation boundary.

According to the method of manufacturing a light emitting device according to an embodiment of the present invention, after the wavelength conversion layer is formed on the entire back surface, the wavelength conversion layer at the outer peripheral region is removed by the separation layer at the separation boundary. Accordingly, a light emitting device having an excellent luminous intensity distribution characteristic can be easily and productively manufactured.

BRIEF DESCRIPTION OF THE DRAWINGS

FIGS. 1A and 1B are schematic diagrams showing a structure of a light emitting device according to a first embodiment of the present invention, in which FIG. 1A is a plan view and FIG. 1B is a cross-sectional view taken along a line I-I in FIG. 1A.

FIGS. 2A and 2B are schematic diagrams showing a structure of a light emitting device according to the first embodiment of the present invention, in which FIG. 2A is a cross-sectional view taken along a line II-II in FIG. 1A and FIG. 2B is a cross-sectional view taken along a line III-III in FIG. 1A.

FIGS. 5A to 5C are schematic cross-sectional views showing a part of operations in a method of manufacturing a light emitting device according to the first embodiment of the present invention, in which FIG. 5A shows forming a semiconductor stacked-layer body, FIG. 5B shows exposing an n-type semiconductor layer, and FIG. 5C shows forming a full-surface electrode.

FIGS. 6A and 6B are schematic cross-sectional views showing a part of operations in a method of manufacturing a light emitting device according to the first embodiment of the present invention, in which FIG. 6A shows forming an oxide layer and FIG. 6B shows forming a metal layer.

FIGS. 7A and 7B are schematic cross-sectional views showing a part of operations in a method of manufacturing a light emitting device according to the first embodiment of the present invention, in which FIG. 7A shows forming a support member and FIG. 7B shows forming an internal wiring.

FIGS. 8A and 8B are schematic cross-sectional views showing a part of operations in a method of manufacturing a light emitting device according to the first embodiment of the present invention, in which FIG. 8A shows forming an electrode for external connection and FIG. 8B shows removing the growth substrate.

FIGS. 9A and 9B are schematic cross-sectional views showing a part of operations in a method of manufacturing a light emitting device according to the first embodiment of the present invention, in which FIG. 9A shows forming a wavelength conversion layer and FIG. 9B shows a state in removing the wavelength conversion layer.

FIGS. 10A and 10B are schematic cross-sectional views showing a part of operations in a method of manufacturing a light emitting device according to the first embodiment of the present invention, in which FIG. 10A shows the wavelength conversion layer removed and FIG. 10B shows singulating.

FIG. 14 is an enlarged schematic cross-sectional view showing a detailed structure of a light emitting device according to the third embodiment of the present invention.

DETAILED DESCRIPTION OF THE EMBODIMENTS

Figure 1A:
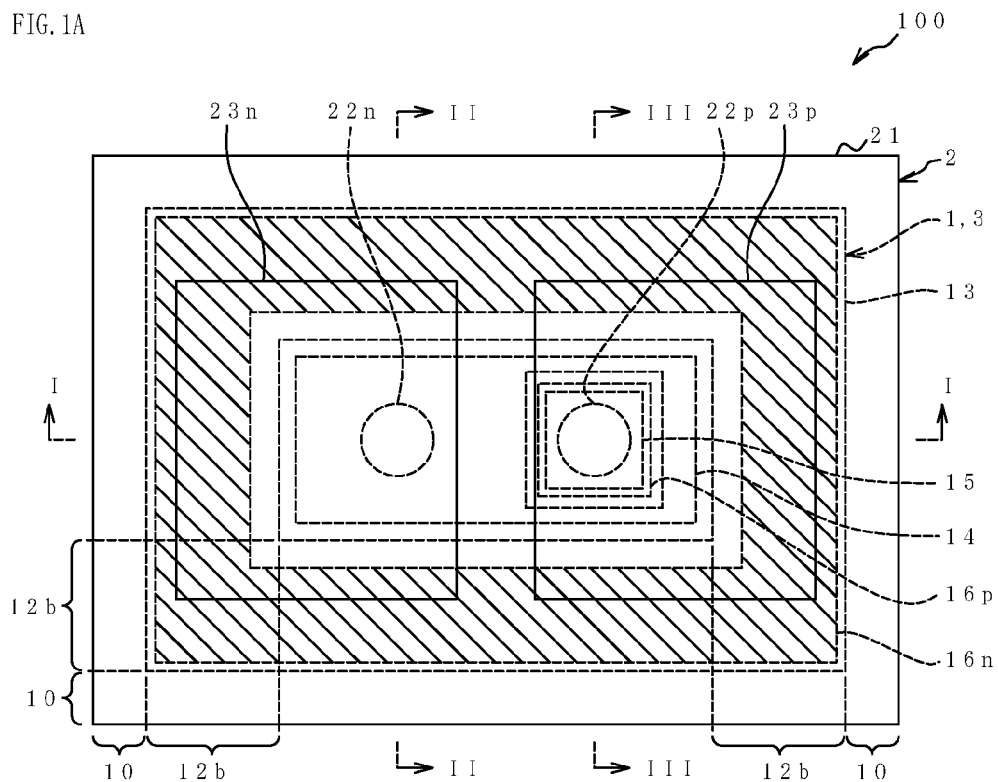

In the following, a method of manufacturing a light emitting device according to embodiments of the present invention will be described. Note that the drawings referred to in the description below schematically show the embodiments of the present invention, and the size, space, interval, and/or positional relationship of the members may be exaggerated or a portion of the members may not be shown. The size, space, and/or interval of the members may not be the same between a plan view and its corresponding cross-sectional view. In the description below, the same designations or the same reference numerals denote the same or like members and detailed description thereof may be omitted as appropriate.

Further, in a light emitting device according to the embodiments of the present invention and a method of manufacturing the same, "top/upper", "bottom/lower", "left", and "right" are to be replaced by one another according to the situation. In the present specification, "top/upper", "bottom/lower" and the like refer to the relative positions between the components in the drawings are for explanation purposes only, and are not intended to indicate absolute positions unless otherwise stated.

First Representative Embodiment

Structure of the Light Emitting Device

First, with reference to FIG. 1A to FIG. 3, a structure of a light emitting device according to a first embodiment will be described. As shown in FIG. 1A to FIG. 3, the outer shape of a light emitting device 100 according to the first embodiment is approximately rectangular parallelepiped-shaped. The light emitting device 100 is a CSP made of a semiconductor light emitting element 1 having a light emitting diode (LED) structure in which a growth substrate is removed (hereinafter referred to as the "light emitting element" as appropriate), a base member 2 disposed on one surface side of the light emitting element 1, and a wavelength conversion layer 3 disposed on the other surface side of the light emitting element 1. An n-side electrode 13 and a p-side electrode 15 are disposed on one surface side of the light emitting element 1 and respectively electrically connected to electrodes for external connection 23n and 23p of corresponding polarities, which are disposed on a support member 21, via internal wirings 22n and 22p, which are metal layers disposed in the support member 21, which is the base material of the base member 2. The light emitting device 100 is a CSP obtained by wafer level processing (i.e., a WCSP), which is described below.

The light emitting device 100 is configured such that a portion or the entire light emitted by the light emitting element 1 is converted to a light of a different wavelength by the wavelength conversion layer 3 to emit the wavelength-converted light or to emit the wavelength-converted light and the light emitted by the light emitting element 1. For example, by configuring the light emitting element 1 to emit a blue light and the wavelength conversion layer 3 to absorb a portion of the blue light and convert the wavelength to emit a yellow light, the light emitting device 100 can be used as a white light source to emit a white light that is a mixture of the blue light and the yellow light.

Next, each of the components of the light emitting device 100 will be described in detail below. The light emitting element 1 has a plate-like shape which is approximately rectangular in a plan view, and is a face down type LED chip provided with the n-side electrode 13 and the p-side electrode 15 on its one surface side. The light emitting element 1 includes a semiconductor stacked-layer body 12 in which an n-type semiconductor layer 12n and a p-type semiconductor layer 12p are stacked. The semiconductor stacked-layer body 12 emits light upon being supplied with electric current flowing between the n-side electrode 13 and the p-side electrode 15, and preferably has an active layer 12a between the n-type semiconductor layer 12n and the p-type semiconductor layer 12p.

The semiconductor stacked-layer body 12 includes a region where the p-type semiconductor layer 12p and the active layer 12a do not partially exist. That is, a region that is recessed from the surface of the p-type semiconductor layer 12p and defined by the n-type semiconductor layer 12n as its bottom surface (this region is referred to as a "step difference 12b") is formed. Further, the n-type semiconductor layer 12n and the n-side electrode 13 are electrically connected to each other at an opening 16n formed through an oxide layer 16 at a portion of the bottom surface of the step difference 12b. A light-transmissive full-surface electrode 14 is disposed on an approximately entire upper surface of the p-type semiconductor layer 12p of the semiconductor stacked-layer body 12. The opening 16n is formed through the oxide layer 16 in the bottom surface of the step difference 12b. An opening 16p is also formed through the oxide layer 16 at a portion of the upper surface of the full-surface electrode 14. The oxide layer 16 covers approximately the entire upper surface of the full-surface electrode 14, the side surfaces of the full-surface electrode 14, and the upper surface and the side surface of the semiconductor stacked-later body 12 and the side surfaces of the step difference 12b. The step difference 12b is not limited to the outer edge portion of the semiconductor stacked-layer body 12 and may be formed at an inner region of the semiconductor stacked-layer body 12.

In the light emitting element 1, the p-side electrode 15, which is the p-side pad electrode, is disposed in the opening 16p defined on a portion of the upper surface of the full-surface electrode 14. The n-side electrode 13, which is the n-side pad electrode, is disposed extending over substantially the entire upper and side surfaces of the semiconductor stacked-layer body 12 via the oxide layer 16, except for the region where the p-side electrode 15 is disposed and in the vicinity of that region. That is, in the light emitting element 1, the n-side electrode 13 and the p-side electrode 15 are disposed on the one surface side of the semiconductor stacked-layer body 12.

The semiconductor stacked-layer body 12 (the n-type semiconductor layer 12n, the active layer 12a, and the p-type semiconductor layer 12p) is suitably made of a nitride-based semiconductor, such as $In_XAl_YGa_{1-X-Y}N$ ($0 \leq X$, $0 \leq Y$, $X+Y < 1$). The semiconductor layers may each have a single-layer structure. Those semiconductor layers may respectively have a single-layer structure, but may also have a stacked-layer structure, a superlattice structure, or the like, which are made of layers of different compositions and thickness. Particularly, the active layer 12a preferably has a single quantum well structure or a multiquantum well structure, which is made of stacked thin layers that each can produce a quantum effect.

Figure 3:
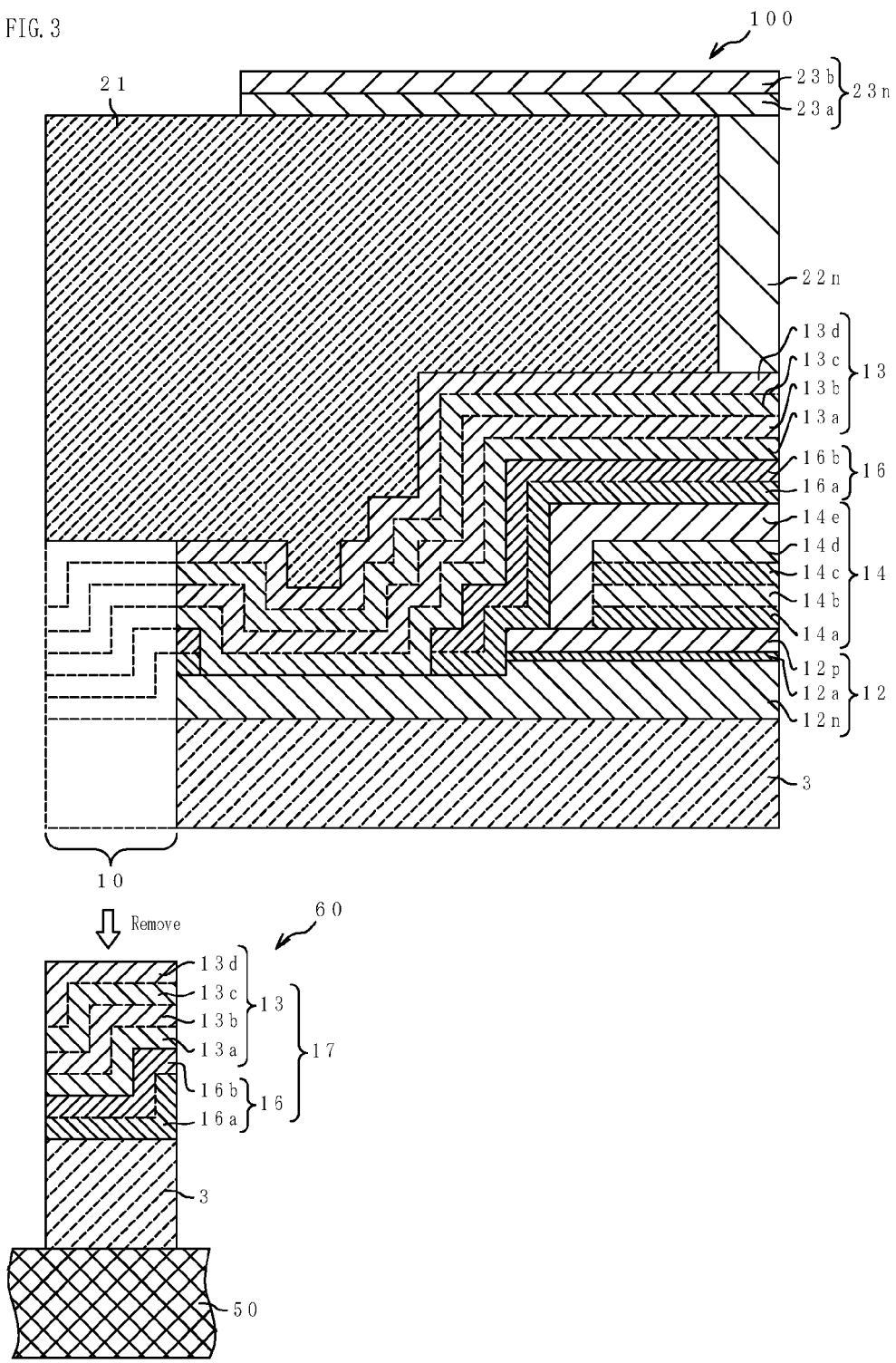
FIG. 3 is an enlarged schematic cross-sectional view showing a detailed structure of the light emitting device according to the first embodiment of the present invention.

The full-surface electrode 14 serves as the current diffusing layer and the light-reflecting layer. As shown in FIG. 3, the full-surface electrode 14 has a structure that includes a first layer 14a, a second layer 14b, a third layer 14c, and a fourth layer 14d that are stacked in this order from the lower layer side and mutually superimposed in a plan view. Further, a fifth layer 14e is disposed to completely cover the upper and side surfaces of the stacked-layer film structure having the first layer 14a to the fourth layer 14d. The first layer 14a may be made of a metal material having good electrically-conductive properties and light-reflecting properties. Particularly, as a metal material having good light-reflecting properties in the visible light region, Ag, Al or an alloy whose main component is one of the foregoing metals that may be suitably employed. The second layer 14b to the fourth layer 14d, particularly the fourth layer 14, may be made of, for example, Ag, where each layer can serve as a barrier layer for preventing the migration of Ag, and can also improve adhesion with a fifth layer 14e, which is a barrier layer further disposed on the outer side. The fifth layer 14e serves as a cover electrode for preventing migration of the material of the first layer 14a, and may be made of a metal material that has good electrically-conductive properties and barrier properties. The end of the fifth layer 14e is arranged to be in contact with the p-type semiconductor layer 12p. As such, the fifth layer 14e is preferably made of a material having good light-reflecting properties. An example of the materials of the first layer 14a to the fifth layer 14e may be Ag, Ni, Ti, Ru, and an Al—Cu alloy in this order respectively.

The full-surface electrode 14 may be made of a single layer. Alternatively, the full-surface electrode 14 may have a two-layer structure in which the first layer 14a to the fourth layer 14d may be a single-layer light-reflecting layer having good light-reflecting properties, and the fifth layer 14e is the cover electrode for preventing migration of the material of the light-reflecting layer.

Figure 1B:
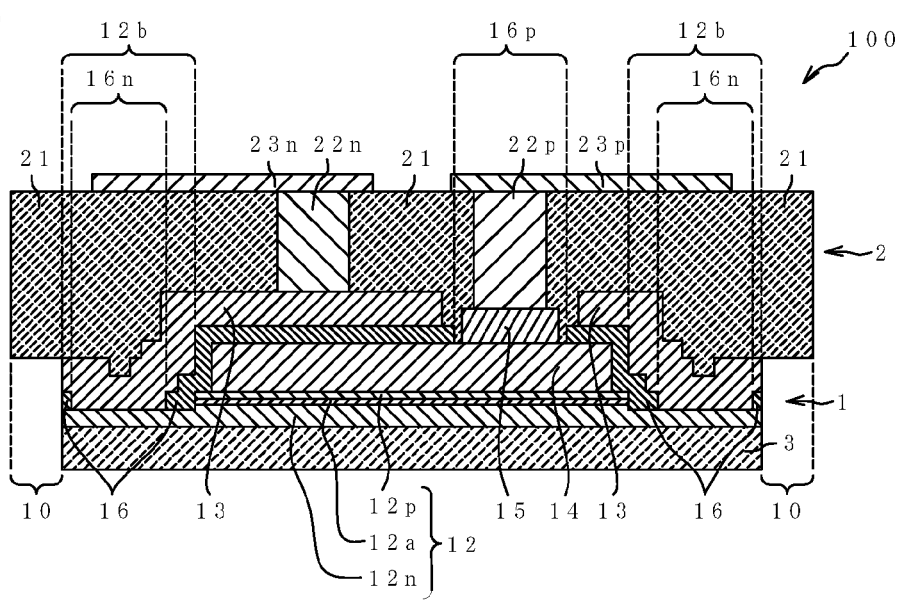
Figure 2A:
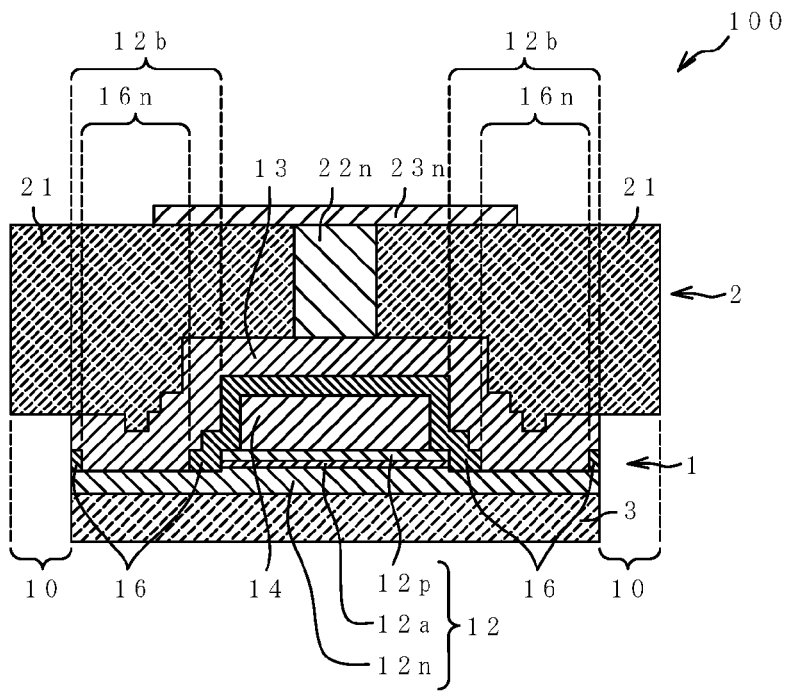
Figure 2B:
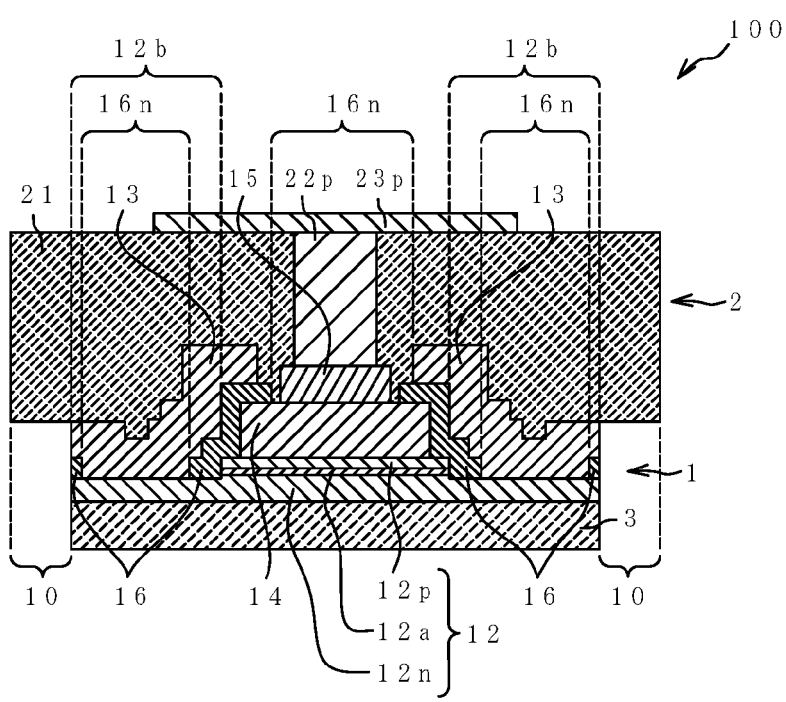

The n-side electrode (metal layer) 13 and the p-side electrode 15 are positive and negative pad electrodes of the light emitting element 1. The n-side electrode 13 is electrically connected to the n-type semiconductor layer 12n through the opening 16n of the oxide layer 16 at the bottom surface of the step difference 12b. As shown by the hatched region in FIG. 1A, the opening 16n that provides the joining portion between the n-type semiconductor layer 12n and the n-side electrode 13 is defined along the entire periphery of the semiconductor stacked-layer body 12. With the opening 16n defined by such a wide area as described above, the current supplied via the n-side electrode 13 can be evenly diffused over the n-type semiconductor layer 12n. Accordingly, the light emission efficiency can be improved. Further, the p-side electrode 15 is disposed on the upper surface of the full-surface electrode 14 in the opening 16p of the oxide layer 16. As shown in FIGS. 1B, 2A and 2B, the internal wirings 22n and 22p of the base member 2 are connected to the n-side electrode 13 and the p-side electrode 15, respectively.

As described above, providing the n-side electrode 13 over the wide area of the upper and side surfaces of the light emitting element 1 allows for efficient heat transfer to the support member 21, which will be described below. Accordingly, the heat dissipating performance can be improved. In the present embodiment, the n-side electrode 13 is provided over the wide area of the light emitting element 1, but in place of or in addition to the n-side electrode 13, the p-side electrode 15 may be provided over the wide area of the light emitting element 1.

The n-side electrode 13 and the p-side electrode 15 may be made of a metal material. For example, a single metal such as Ag, Al, Ni, Rh, Au, Cu, Ti, Pt, Pd, Mo, Cr, or W, or an alloy whose main component is one of the foregoing metals may be suitably used. Note that, in the case of using an alloy, the alloy may contain a non-metal element such as Si as a constituent element, for example an Al—Si—Cu alloy (ASC). Further, the n-side electrode 13 and the p-side electrode 15 may respectively have a single-layer structure or a stacked-layer structure of the foregoing metal materials. Examples of the stacked-layer structure include, in order from the semiconductor stacked-layer body 12 side, Ti/ASC/Ni and Ti/ASC/Pd.

In the present embodiment, the n-side electrode 13 and the p-side electrode 15 each have a four-layer structure. Since the stacked-layer structure of the p-side electrode 15 is similar to the stacked-layer structure of the n-side electrode 13, the stacked-layer structure of the n-side electrode 13 will be described. In the present embodiment, the interface between the fourth layer 13d, which is the uppermost layer, and the support member 21 serves as a separation boundary when the wavelength conversion layer 3 is peeled off from the support member 21 side in the outer peripheral region 10. Therefore, the fourth layer 13d is made of a material in which the adhesion strength to the support member 21 is smaller than the adhesion strength between the n-side electrode 13 and the oxide layer 16 and the adhesion strength between the oxide layer 16 and the wavelength conversion layer 3. Accordingly, the material is selected so that the layer that includes the wavelength conversion layer 3 is peeled off at the outer peripheral region 10 of the light emitting device and at the interface between the support member 21 and the n-side electrode 13, which is a metal layer.

Further, the material of the first layer 13a that is in contact with the oxide layer 16, which is made of an oxide, is selected so as to obtain good adhesion strength to the second layer 16b, which is the uppermost layer of the oxide layer 16. Further, the n-side electrode 13 that is disposed at the region except for the outer peripheral region 10 also functions as the light-reflecting layer that reflects the light emitted by the semiconductor stacked-layer body 12. Accordingly, the first layer 13a is preferably made of Al or an Al alloy, which has good light-reflecting properties. The materials of the second layer 13b and the third layer 13c of the n-side electrode 13 are each selected taking into consideration the adhesion between the first layer 13a and the fourth layer 13d and the like. The details of a method of peeling off the wavelength conversion layer 3 located at the outer peripheral region 10 by using the relative magnitudes of the adhesion strengths between the layers and the specific material structure of each layer will be described below.

Further, in the present embodiment, the n-side electrode 13 is formed extending into the outer peripheral region 10 in the manufacturing process. But, in place of or in addition to the n-side electrode 13, the p-side electrode 15 may be formed extending into the outer peripheral region. In this case, the stacked-layer structure of the p-side electrode 15 may be formed similar to the stacked-layer structure of the n-side electrode 13 described above.

The oxide layer 16 is a light-transmissive layer made of a metal oxide or an oxide of a semimetal. The oxide layer 16 serves as a protective film for protecting the semiconductor stacked-layer body 12 and the full-surface electrode 14 and also serves as an interlayer insulating film for allowing the n-side electrode 13 to extend over a wide area of the semiconductor stacked-layer body 12 and the full-surface electrode 14. As shown in FIG. 3, the oxide layer 16 is made of a stacked layer of a first layer 16a and a second layer 16b.

Each layer structuring the oxide layer 16 may be suitably made of an oxide containing, for example, at least one element selected from the group consisting of Si, Ti, Zr, Nb, Ta, Al, and Hf. Further, as the oxide layer 16, two or more types of light-transmissive dielectrics with different refractive indices may be stacked to form a distributed Bragg reflector (DBR) film.

The first layer 16a in the outer peripheral region 10 is a separation layer that is used in the removal of the growth substrate 11 (S109) (see FIG. 4) in order to separate the growth substrate 11 by peeling off from the semiconductor stacked-layer body 12 (see FIGS. 8A and 8B) by using a laser lift-off (LLO) method, where in a boundary region 12c, the growth substrate 11 is peeled off from the oxide layer 16, which is in contact with the growth substrate 11. The first layer 16a may be more suitably made of $Nb_2O_5$. The second layer 16b is a main layer of the oxide layer 16 that serves as a protective film and an insulating film. The second layer 16b is preferably made of a material which has good light-transmissive property and electrically insulative property. The second layer 16b may be more suitably made of $SiO_2$.

Note that the light emitting element 1 shown in FIGS. 1A to 3 is an example, and the present invention is not limited thereto. In the light emitting element 1, the n-side electrode 13 and the p-side electrode 15 are disposed on one surface side of the semiconductor stacked-layer body 12. However, the arrangement of the region of the step difference 12b, the n-side electrode 13, and the p-side electrode 15, or the like, can be determined as appropriate.

The base member 2 has a rectangular parallelepiped-shape, which, in a plan view, encloses the outer shape of the light emitting element 1. The base member 2 is disposed to be bonded to the surface of the light emitting element 1 where the n-side electrode 13 and the p-side electrode 15 are disposed. The base member 2 serves as a reinforcing member for mechanically supporting the structure of the light emitting element 1 from which the growth substrate 11 (see FIGS. 5A to 5C and others) is removed. Further, the base member 2 has an approximately similar outer shape as the wavelength conversion layer 3 in a plan view. The base member 2 includes the support member 21, the electrodes for external connection 23n and 23p for mounting on a mounting substrate, and the internal wirings 22n and 22p for electrically connecting the n-side electrode 13 and the p-side electrode 15 to the electrodes for external connection 23n and 23p of corresponding polarities, respectively.

The support member 21 is a base material as the reinforcing member of the light emitting element 1. As shown in FIGS. 1A to 2B, the support member 21 has an outer shape approximately similar to that of the base member 2, and in a plan view, the outer peripheral shape of the support member 21 encloses the outer peripheral shape of the light emitting element 1. The support member 21 is a sealing member that seals the upper surface of the light emitting element 1. In the outer peripheral region 10, a lower surface of the support member 21 is exposed without being in contact with either the light emitting element 1 or the wavelength conversion layer 3 at the outer peripheral region 10, which is a region outer than the semiconductor stacked-layer body 12 in a planar view.

As shown in FIG. 3, the wavelength conversion layer 3 of the outer peripheral region 10 can be removed by peeling the wavelength conversion layer 3 off from the support member 21 by using a sheet 50 that has an adhesive surface, the details of which will be described below. At the time of removing the wavelength conversion layer 3 from the outer peripheral region 10, the peeling off occurs at the interface between the n-side electrode 13 and the support member 21 in the outer peripheral region 10, so that the n-side electrode 13 and the oxide layer 16 are also removed together with the wavelength conversion layer 3. Accordingly, the lower surface of the support member 21 is exposed at the outer peripheral region 10.

Further, the electrodes for external connection 23n and 23p are disposed on the upper surface of the support member 21. The support member 21 includes the internal wiring 22n for electrically connecting the n-side electrode 13 and the electrode for external connection 23n, and the internal wiring 22p for electrically connecting the p-side electrode 15 and the electrode for external connection 23p.

Examples of the resin material of the support member 21 include a silicone resin, a modified silicone resin, an epoxy resin, a modified epoxy resin, a urea resin, a phenolic resin, an acrylate resin, a urethane resin, a fluororesin, or a hybrid resin containing at least one type of the foregoing resins. In the case where the support member 21 is formed by compression molding, as a raw material, for example, an epoxy mold compound (EMC) which is a powdery epoxy-base resin, or a silicone mold compound (SMC), which is a powdery silicone-base resin, can be suitably employed. The support member 21 preferably has a thickness of about 30 µm or greater in order to exhibit sufficient mechanical strength as the reinforcing member of the light emitting element 1 from which the growth substrate has been removed. In view of productivity, the support member 21 preferably has a thickness of about 500 µm or less.

Also, in order to improve thermal conductivity, the support member 21 may contain a thermally conductive member. By increasing the thermal conductivity of the support member 21, the heat generated by the light emitting element 1 can be quickly transferred and released to the outside. For the thermally conductive member, for example, granular carbon black, aluminum nitride (AlN) and the like can be used. In the case where the thermally conductive member is made of an electrically conductive material, the thermally conductive member can be contained by a particle density within a range such that the support member 21 does not exhibit electrically-conductive properties.

Further, the support member 21 may be made of a white resin, which is a light-transmissive resin material that contains a light-reflecting filler. The white resin is used at least at the lower layer portion of the support member 21, which is bonded to the upper surface of the light emitting element 1 so that a portion of the support member 21 located adjacent to the light emitting element 1 can be used as the light-reflecting film. With this arrangement, the light leaking out from the upper and side surface of the light emitting element 1 can be returned to the light emitting element 1, so that the light extraction efficiency of the lower surface side that is the light extraction surface of the light emitting element 1 can be improved.

The internal wiring 22n is included inside the support member 21 to electrically connect the n-side electrode 13 and the electrode for external connection 23n. The lower surface of the internal wiring 22n is bonded to the upper surface of the n-side electrode 13, and the upper surface of the internal wiring 22n is bonded to the electrode for external connection 23n. The internal wiring 22p is disposed inside the support member 21 to electrically connect the p-side electrode 15 and the electrode for external connection 23p. The lower surface of the internal wiring 22p is bonded to the upper surface of the p-side electrode 15, and the upper surface of the internal wiring 22p is bonded to the electrode for external connection 23p. The internal wirings 22n and 22p also function as heat transferring paths for releasing heat generated by the light emitting element 1.

The internal wirings 22n and 22p may be metal layers formed respectively on the n-side electrode 13 and the p-side electrode 15 by using an electroplating method. The internal wirings 22n and 22p can also be formed by wire bonding one end of a metal wire to each of the n-side electrode 13 or the p-side electrode 15 and stretching the wires upward. Also, the internal wirings 22n and 22p can each be formed with a stacked bump structure, which is formed by stacking wire bumps on top of each other at the time of ball bonding of a metal wire. Moreover, the internal wirings 22n and 22p can also be formed by a combination of the above methods.

The internal wirings 22n and 22p are preferably made of a material having good electrically conductive properties and thermal conductive properties. For example, Au, Cu, Al, Ag or an alloy whose main component is the foregoing metals can be suitably employed. The internal wirings 22n and 22p may be metal wires having a surface coating.

The electrodes for external connections 23n and 23p are disposed on the upper surface of the support member 21, and serve as the pad electrodes for bonding the light emitting device 100 to the external mounting substrate. The electrodes for external connections 23n and 23p are disposed to be electrically connected to the exposed surfaces of the internal wirings 22n and 22p, which are exposed from the support member 21, respectively. The locations for disposing the electrodes for external connections 23n and 23p are not limited to locations on the upper surface of the support member 21. The electrodes for external connections 23n and 23p may be disposed at one or more side surfaces of the support member 21 or disposed on the upper surface and a side surface of the support member 21. Further, in place of providing the electrodes for external connections 23n and 23p, the exposed surface of each of the internal wirings 22n and 22p exposed from the support member 21 may be used as the connection surface to the outside for mounting.

Further, the electrodes for external connections 23n and 23p may each have a single-layer structure or a multilayer structure. In the case where the electrodes for external connections 23n and 23p each have a two-layer structure, for example, as shown in FIG. 3, at least the second layer 23b, which is the uppermost layer, is preferably made of Au for the purpose of improving the bonding property with the mounting substrate through the use of an Au alloy-base bonding material, such as an Au—Sn eutectic solder. Further, for example, in the case where the internal wirings 22n and 22p are formed by a metal other than Au, such as Cu or Al, for the purpose of improving adhesion with Au and adhesion with the support member 21, the first layer 23a, which is the lowest layer, is preferably formed as, for example, a thin film of Ni that can obtain good adhesion with such materials. For example, a three-layer structure, Ni/Pd/Au, with a Pd layer in the middle may be employed. The electrodes for external connections 23n and 23p can be formed by any one of, or a combination of, sputtering, deposition, electroless plating and the like. Further, the electrodes for external connections 23n and 23p may have a total thickness of about 0.1 μm to about 5 μm, and preferably about 0.5 μm to about 4 μm.

The wavelength conversion layer 3 is configured to absorb a portion or whole light emitted by the light emitting element 1, and converts the light into a light of a different wavelength than the light emitted by the light emitting element 1. The wavelength conversion layer 3 can be formed as a resin layer that contains particles of a phosphor as the wavelength conversion material. Further, the wavelength conversion layer 3 is disposed to be in contact with the entire lower surface of the n-type semiconductor layer 12n, which is the light extraction surface of the light emitting element 1. Further, as described above, the wavelength conversion layer 3 is not provided in the outer peripheral region 10, which is a region outer than the semiconductor stacked-layer body 12 in a plan view.

The thickness of the wavelength conversion layer 3 can be determined according to the content of the phosphor, the desired color of light to be obtained by mixing the light emitted by the light emitting element 1 and the wavelength-converted light, and the like. For example, the thickness of the wavelength conversion layer 3 may be about 1 μm to about 500 μm, more preferably about 5 μm to about 200 μm, and further preferably about 10 μm to about 100 μm.

The resin material structuring the wavelength conversion layer 3 may be any material known in the art. It is preferable to employ the material having excellent light transmissivity to the light emitted by the light emitting element 1 and the light having undergone wavelength conversion by the phosphor contained in the wavelength conversion layer 3. Such a resin material may be, for example, a silicone resin, a modified silicone resin, an epoxy resin, a modified epoxy resin, a urea resin, a phenolic resin, an acrylate resin, a urethane resin, a fluororesin, or a hybrid resin containing at least one type of the foregoing resins.

The phosphor (the wavelength conversion member) is not specifically limited so long as the phosphor material can be excited by light of the wavelength emitted by the light emitting element 1 to emit a fluorescent light of a different wavelength than the exciting light. Two or more types of phosphors may be evenly mixed in the wavelength conversion layer 3 or may be distributed to form a multilayer structure.

The wavelength conversion layer 3 can be formed as follows. A slurry made of a solvent containing the above-noted resin, phosphor particles, and other inorganic filler particles is provided. The provided slurry is applied onto the lower surface of the semiconductor stacked-layer body 12 by using an appropriate coating method such as a spraying method, a casting method, or a potting method. Thereafter, the applied slurry is cured.

Operation of the Light Emitting Device

Next, with reference to FIGS. 1A and 1B, operation of the light emitting device 100 will be described. Note that, for the sake of convenience in explanation, description will be given assuming that the light emitting element 1 is configured to emit a blue light, and the wavelength conversion layer 3 is configured to emit a yellow light.

The light emitting device 100 is configured such that, when an external power supply is connected to the electrodes for external connections 23n and 23p, which are the positive and negative electrodes, via the mounting substrate, current is supplied between the n-side electrode 13 and the p-side electrode 15 of the light emitting element 1 via the internal wirings 22n and 22p. Then, when the current is supplied between the n-side electrode 13 and the p-side electrode 15, the active layer 12a of the light emitting element 1 emits a blue light.

The blue light emitted by the active layer 12a of the light emitting element 1 propagates in the semiconductor stacked-layer body 12 and is emitted from the lower surface of the light emitting element 1. A portion of the emitted blue light is absorbed by the phosphor contained in the wavelength conversion layer 3 and converted into a yellow light and extracted to the outside. A portion of the blue light that transmits through the wavelength conversion layer 3 without being absorbed by the phosphor is extracted to the outside. Further, the light upwardly propagating in the light emitting element 1 is reflected downward by the full-surface electrode 14, and output from the lower surface of the light emitting element 1. Then, the yellow light and the blue light extracted to the outside of the light emitting device 100 are mixed with each other, whereby a white light is generated. Note that, since the light emitting device 100 is not provided with the wavelength conversion layer 3 at the outer peripheral region 10, the white light can be outputted with a luminous intensity distribution characteristic that exhibits little inconsistency of color.

Method of Removing the Wavelength Conversion Layer in the Outer peripheral Region Before describing a method of manufacturing the light emitting device in detail, a description will be given of a step of removing the wavelength conversion layer 3, which is once formed at the outer peripheral region 10, in order to exclude the wavelength conversion layer 3 from the outer peripheral region 10. Also, the configuration of the n-side electrode (metal layer) 13 and the oxide layer 16, which serve as the separation layer 17, that can facilitate removing of the wavelength conversion layer 3 is also described.

In the present specification, the term "separation layer" refers to the layer which is disposed between the wavelength conversion layer 3 and the support member 21 and provides a separation boundary at the time of removing the wavelength conversion layer 3 in the outer peripheral region 10. The expression "to serve as the separation boundary" means to become the interface at which the peeling of the upper surface side or lower surface side of the separation layer 17 or within the separation layer 17 takes place. In other words, the wavelength conversion layer 3 is removed by separating the separation layer 17 at the separation boundary. In the first embodiment, the separation layer 17 is a stacked layer of the oxide layer 16 and the n-side electrode 13. The separation layer 17 in other embodiments will be described in respective embodiments.

During the manufacturing process, the n-side electrode 13, the oxide layer 16, and the wavelength conversion layer 3 are stacked in this order from the lower surface side of the support member 21 and in the outer peripheral region 10 of the light emitting device 100, which is indicated by the region represented by the broken lines without hatching in FIG. 3. Subsequently, the adhesive sheet 50 is attached to the lower surface of the wavelength conversion layer 3 and then peeled. At this time, in the outer peripheral region 10, the lower layer at the interface that has a lowest adhesion among the interfaces between the layers is separated. Thus, the wavelength conversion layer 3 at the outer peripheral region 10 is removed.

As shown in FIG. 3, in the light emitting device 100 according to the first embodiment, the interface between the support member 21 and the n-side electrode 13 serves as the separation interface, and a peeled fragment 60 of a stacked layer of the n-side electrode 13, the oxide layer 16, and the wavelength conversion layer 3 is removed. In order to obtain the above, in the first embodiment, the materials of the layers are selected so that the relative magnitudes of the adhesion strengths between the layers satisfies the formula (1), where "a" indicates the adhesion strength between the oxide layer 16 and the wavelength conversion layer 3, "b" indicates the adhesion strength between the n-side electrode 13 and the oxide layer 16, "c" indicates the adhesion strength between the support member 21 and the n-side electrode 13, and "d" indicates the adhesion strength between the wavelength conversion layer 3 and the adhesive sheet 50. Further, the signs "a", "b", "c", and "d" indicating the adhesion strengths between the layers are used in the same manner in the description of the adhesion strengths in the second and third embodiments to be described below.

Relative Magnitudes of Adhesion Strengths Between Layers $$a > c, \ b > c, \ c < d \tag{1}$$

In formula (1), either an adhesion strength "a" between the oxide layer 16 and the wavelength conversion layer 3 or an adhesion strength "b" between the n-side electrode 13 and the oxide layer 16 may be set strictly greater than the other.

In the notations above, the sign ">" means that the adhesion strength of the latter of the inequality sign is strictly smaller than the adhesion strength of the former of the inequality sign. Here, the expression "adhesion strength is strictly smaller" means that at the time of attaching and peeling of the adhesive sheet 50, separation selectively occurs at the interface where the adhesion strength is strictly smaller.

Further, as indicated in formula (2) below, there is a premise that the sheet 50 has an adhesion strength such that the adhesion strength "e" between the wavelength conversion layer 3 and the semiconductor stacked-layer body 12 is greater than the adhesion strength "d" between the wavelength conversion layer 3 and the sheet 50.

$$e > d \tag{2}$$

This premise is also applied in the second and third embodiments, which are described below.

In the first embodiment, as described above, the materials are selected such that the adhesion strength between the support member 21 and the n-side electrode 13 is smaller than the adhesion strengths between the other layers, so that peeling occurs at the interface between the support member 21 and the n-side electrode 13. Examples of the metal material that has a small adhesion strength to the resin material (epoxy resin, silicone resin or the like) used for the support member 21 include Au or platinum group metals (Ru, Rh, Pd, Pt and the like). In particular, due to its small adhesion strength to a resin material, Au can be suitably used for the fourth layer 13d, which is the uppermost layer of the n-side electrode 13.

Also, Au and platinum group metals have a small adhesion strength to oxides ($SiO_2$, $TiO_2$, $Nb_2O_5$, $Al_2O_3$ and the like), so that the first layer 13a that is the lowermost layer of the n-side electrode 13 and is in contact with the oxide layer 16 made of an oxide is preferably made of a metal other than Au and platinum group metals. The n-side electrode 13 disposed in the region other than the outer peripheral region 10 also serves as the light-reflecting layer that reflects the light emitted by the semiconductor stacked-layer body 12. As such, the first layer 13a is preferably made of Al or an Al alloy, which has good light-reflecting properties. For the Al alloy, an Al—Si—Cu alloy (e.g., Cu: 2 mass %, Si: 1 mass %, Al: balance), an Al—Cu alloy (e.g., Cu: 2 mass %, Al:balance) and the like, can be used.

The second layer 13b and the third layer 13c of the n-side electrode 13 may be made of, for example, Ti and Pt, respectively, taking into consideration the adhesion between the first layer 13a and the fourth layer 13d. Note that the n-side electrode 13 is not limited to having the four-layer structure, and may have a two-layer structure in which the first layer 13a and the fourth layer 13d made of the above-noted materials are stacked.

The second layer 16b, which is an uppermost layer of the oxide layer 16, is preferably made of an insulating oxide such as $SiO_2$, $TiO_2$, $Nb_2O_5$, or $Al_2O_3$ so that good adhesion strength to the first layer 13a of the n-side electrode 13 can be obtained. The adhesion strength between the first layer 16a, which is a lowermost layer, and the wavelength conversion layer 3 made of a resin material is set to be greater than the adhesion strength between the support member 21 and the n-side electrode 13. The first layer 16a may be made of an insulating oxide such as $SiO_2$, $TiO_2$, $Nb_2O_5$, or $Al_2O_3$, for example. Further, as described above, the first layer 16a is preferably made of $Nb_2O_5$, which is suitable for the layer that separates at the time of removing the growth substrate 11 (see FIG. 8A) by using an LLO method. The $Nb_2O_5$ that is separated by way of an LLO method is a layer in which a metal and an oxide coexist. In contact with this layer, the wavelength conversion layer 3 made of a resin material is formed. The oxide layer 16 is insulating as a whole and an electrically conductive material may be used for the intermediate layer.

Method of Manufacturing Light Emitting Device

Figure 4:
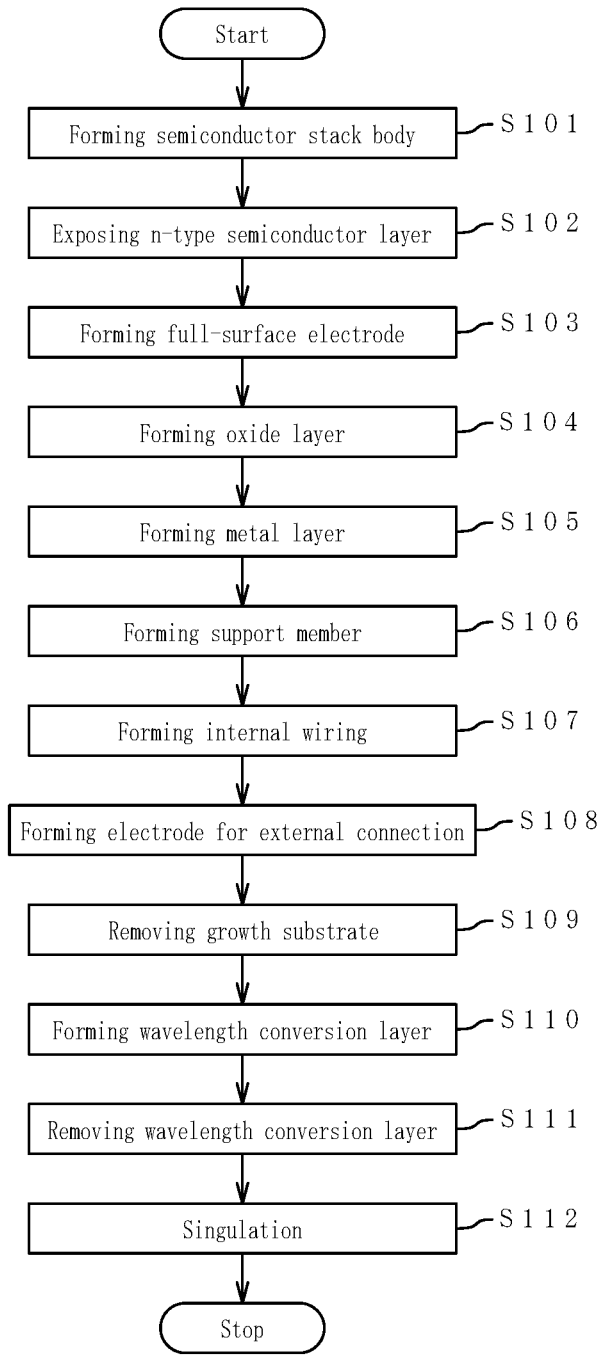
FIG. 4 is a flowchart showing the flow of operations of manufacturing a light emitting device according to the first embodiment of the present invention.

Next, with reference to FIG. 4, a method of manufacturing the light emitting device 100 shown in FIGS. 1A to 3 will be described. As shown in FIG. 4, a method of manufacturing a light emitting device 100 includes forming a semiconductor stacked-layer body (S101), exposing an n-type semiconductor layer (S102), forming a full-surface electrode (S103), forming an oxide layer (S104), forming a metal layer (S105), forming a support member (S106), forming internal wirings (S107), forming electrodes for external connection (S108), removing the growth substrate (S109), forming a wavelength conversion layer (5110), removing the wavelength conversion layer (S111), and singulating (S112), which are performed in this order.

Each step will be described in detail below with reference to FIGS. 5A to 10B (also to FIGS. 1A to 4 as appropriate). In each of FIGS. 5A to 10B, the shape, size, and/or positional relationship of the members may be simplified or exaggerated as appropriate. In the method of manufacturing the light emitting device 100 according to the present embodiment, a plurality of semiconductor stacked-layer bodies 12 are formed in a wafer state in which a plurality of semiconductor stacked-layer bodies are arrayed on a single growth substrate (may be referred simply as "substrate") 11. The cross-sectional views of FIGS. 5A to 10B illustrate simultaneous formation of the light emitting devices 100 in the lateral direction.

Figure 5A:
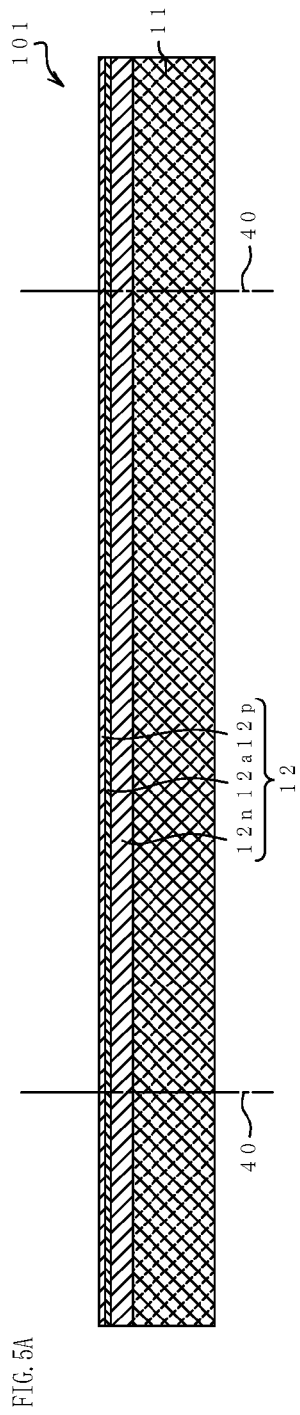

First, in the step of forming the semiconductor stacked-layer body (S101), which includes the step of providing a wafer 101, as shown in FIG. 5A, on an upper surface of the growth substrate 11 made of sapphire or the like, the n-type semiconductor layer 12n, the active layer 12a, and the p-type semiconductor layer 12p are successively stacked using the semiconductor materials described above to form the semiconductor stacked-layer body 12.

Figure 5B:
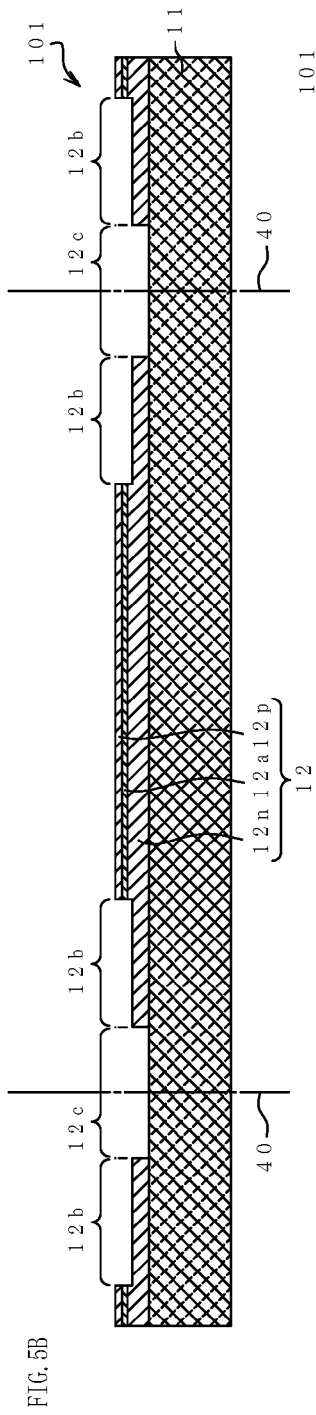

Next, in the step of exposing the n-type semiconductor layer (S102), which includes the step of providing a wafer 101, as shown in FIG. 5B, at a part of the region of the upper surface of the semiconductor stacked-layer body 12, the p-type semiconductor layer 12p, the active layer 12a, and portions of the n-type semiconductor layer 12n are removed by way of etching to form step differences 12b where the n-type semiconductor layer 12n is exposed. Further, simultaneously with or following the formation of the step differences 12b, at the boundary regions 12c of a predetermined width provided respectively along the boundary lines 40 that demarcate the to-be-formed light emitting devices 100, the p-type semiconductor layer 12p, the active layer 12a, and the n-type semiconductor layer 12n are removed by way of etching to expose the growth substrate 11. This eliminates the necessity of dicing the semiconductor stacked-layer body 12 in the step of singulating (S112), and hence singulation can be easily made by dicing only the support member 21. Further, removing the semiconductor stacked-layer body 12 in the boundary regions 12c allows separation to occur at an interface of smaller adhesion strength than the adhesion strength between the semiconductor stacked-layer body 12 and the wavelength conversion layer 3 so that the layer side lower than the interface can be removed.

As described above, the step of providing a wafer 101 includes the steps of forming the semiconductor stacked-layer body (S101) and exposing the n-type semiconductor layer (S102). That is, through the step of providing a wafer 101, the semiconductor stacked-layer body 12 is stacked on the growth substrate 11, and a wafer 101 is provided in which, in a plan view, the upper surface of the growth substrate 11 is exposed at the outer peripheral region of each of the semiconductor stacked-layer bodies 12 that are to be singulated.

Figure 5C:
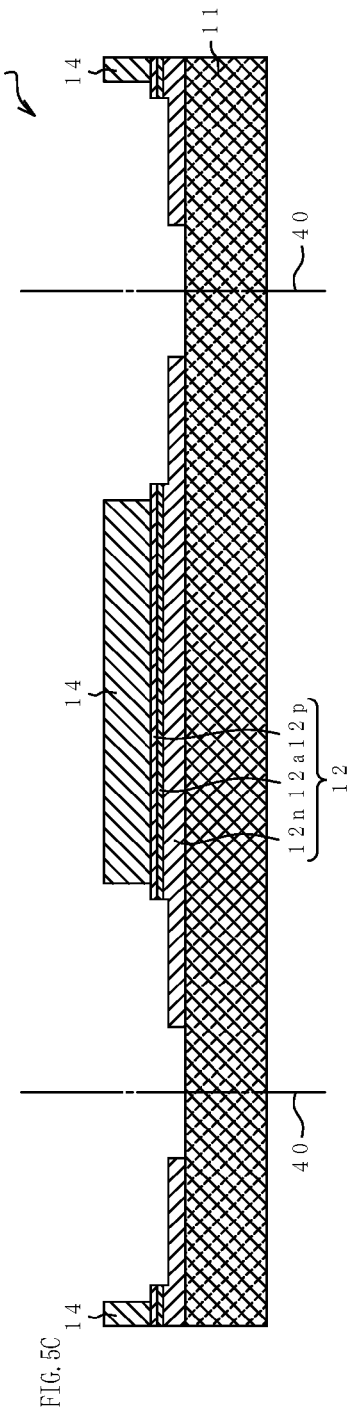

Next, in the step of forming the full-surface electrode (S103), as shown in FIG. 5C, the full-surface electrode 14 is formed by using a predetermined metal material on substantially the entire upper surface of the p-type semiconductor layer 12p. Patterning of the full-surface electrode 14 can be obtained such that a resist pattern is formed by using a photolithography method and, using the resist pattern as an etching mask, an etching method is performed. Patterning of the full-surface electrode 14 can also be obtained such that the resist pattern is formed, then a film of a metal material is formed, and the resist pattern is removed.

Figure 6A:
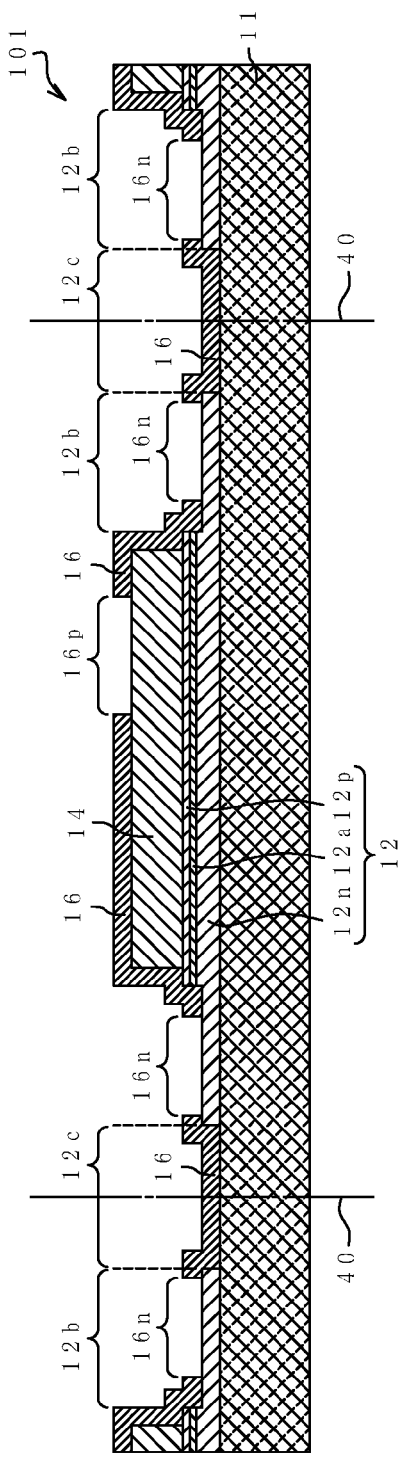

Next, in the step of forming the oxide layer (S104), as shown in FIG. 6A, the oxide layer 16 is formed to define the openings 16n at the bottom surface of the step differences 12b, and to define the openings 16p at a portion of the upper surface of the full-surface electrode 14. As shown in FIG. 3, the oxide layer 16 is formed as a stacked-body of oxides.

The first layer 16a, which is a lowermost layer, is formed by using a sputtering method or the like and using a material suitable for separation of the growth substrate 11 by performing an LLO method, for example $Nb_2O_5$. Further, the second layer 16b can be formed by using, for example, $SiO_2$ and a sputtering method or the like. Patterning of the oxide layer 16 can be obtained such that a resist pattern with openings at the regions corresponding to the openings 16n and 16p is formed by using a photolithography method, and the oxide layer 16 is etched by using the resist pattern as a mask.

Figure 6B:
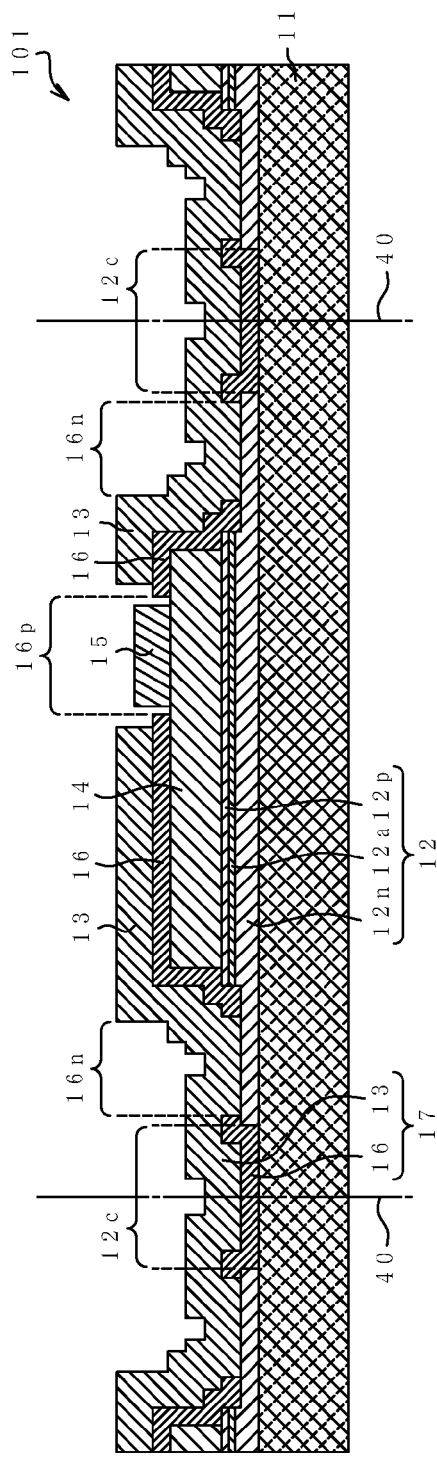

Next, in the step of forming the metal layer (S105), as shown in FIG. 6B, the n-side electrode 13 and the p-side electrode 15, which are the pad electrodes, are formed. The n-side electrode 13 is formed to be electrically connected to the n-type semiconductor layer 12n at the opening 16n of the oxide layer 16 formed at the step difference 12b, and to further extend over a wide area on the oxide layer 16. Further, the p-side electrode 15 is formed to be electrically connected to the full-surface electrode 14 at the opening 16p of the oxide layer 16 formed at the upper surface of the full-surface electrode 14.

The n-side electrode 13 and the p-side electrode 15 are simultaneously formed in this operation. More specifically, first, over the entire upper surface of the wafer 101, a stacked-layer body of metal films is formed by using a sputtering method or the like, using the corresponding metal materials successively such that the above-described stacked-layer structure is formed. That is, the metal films are formed not only on the regions over each of the semiconductor stacked-layer bodies 12, but also on the boundary regions along the boundary lines 40. Next, by using a photolithography method, a resist pattern with openings at the regions demarcating the n-side electrode 13 and the p-side electrode 15 is formed. Then, etching is performed using the resist pattern as a mask to separate the n-side electrode 13 and the p-side electrode 15 and, thus, the metal films are patterned. The metal films may be patterned by using a lift-off method in place of using the etching method.

In the present embodiment, the first layer 13a, which is the lowermost layer of the n-side electrode 13, is formed by using a material that has good adhesion to the second layer 16b, which is the uppermost layer of the oxide layer 16. Further, the fourth layer 13d, which is the uppermost layer, is formed by using a material that has low adhesion to the support member 21. Note that, as used herein, the term "low adhesion" means a smallest adhesion among the adhesion between the support member 21 and the n-side electrode 13, the adhesion between the n-side electrode 13 and the oxide layer 16, and the adhesion between the oxide layer 16 and the wavelength conversion layer 3. The term "good adhesion" means that the adhesion is at least not the lowest among the adhesion at the three interfaces described above. Further, each interface in the stacked-layer structure of each of the n-side electrode 13 and the oxide layer 16 is an interface between metals or between oxides such that relatively good adhesion can be obtained and, also compared to any interface between the above-described different materials of metals, oxides, and resins, greater adhesion can be obtained.

Note that the steps of forming the oxide layer (S104) and forming a metal layer (S105) are combined to form a step of forming a separation layer. That is, by performing the step of forming a separation layer, the separation layer 17 that integrally covers the upper surface of the growth substrate 11 and the upper surface of the semiconductor stacked-layer body 12 is formed. Here, the separation layer 17 is a layer structured by the oxide layer 16 and the n-side electrode 13 being stacked in the outer peripheral region 10.

Next, in the step of forming the support member (S106), as shown in FIG. 7A, the support member 21 is formed to provide an opening 21n within the outer periphery of the full-surface electrode 14 in a plan view and in a portion of the upper surface of the n-side electrode 13, and to provide an opening 21p on the p-side electrode 15. The support member 21 can be provided with the openings 21n and 21p as follows. A resin film is formed by using a coating method such as a spin coating method and a spraying method, or by using a compression molding method. Then, a resist pattern with openings at regions corresponding to the openings 21n and 21p is formed on the resin film by using a photolithography method. Then, the resin film is etched by using the resist pattern as a mask to form the openings 21n and 21p. The support member 21 with the openings 21n and 21p can also be formed as follows. A resist pattern is formed by using a photolithography method to cover the regions where the openings 21n and 21p to be provided. The support member 21 is formed by using a compression molding method or the like. Then, the upper surface of the support member 21 is ground to expose the resist pattern. Then, the resist pattern is removed to form the openings 21n and 21p.

Next, in the step of forming the internal wirings (S107), as shown in FIG. 7B, in the openings 21n and 21p of the support member 21, metal layers are formed by, for example, using an electroplating method, as the internal wirings 22n and 22p. In the case of using an electroplating method, more specifically, the internal wirings 22n and 22p can be formed as described below. First, a seed layer made of a metal is formed on the entire surface of the support member 21 and into the openings 21n and 21p, by using a sputtering method or the like. Next, using the seed layer as a current path, a metal film is grown by using an electroplating method. Then, the support member 21 and the metal layer obtained by the electroplating are ground from the upper surface so that the support member 21 has a predetermined thickness. Thus, the upper surface of each of the internal wirings 22n and 22p is exposed at the upper surface of the support member 21.

Further, in the case of using metal wires or bump stack bodies for the internal wirings 22n and 22p, the steps of forming the support member (S106) and the forming the internal wirings (S107) can be performed by switching the order. That is, first, in the step of forming the internal wirings (S107), the internal wirings 22n and 22p, such as metal wires or the like, are disposed on the n-side electrode 13 and the p-side electrode 15, respectively. Next, the support member 21 is formed so that the internal wirings 22n and 22p are buried. Thereafter, the support member 21 and the internal wirings 22n and 22p, such as the metal wires, are ground from the upper surfaces so that the support member 21 has a predetermined height. Thus, the upper surface of each of the internal wirings 22n and 22p is exposed at the upper surface of the support member 21.

Next, in the step of forming electrodes for external connection (S108), as shown in FIG. 8A, the electrodes for external connection 23n and 23p are formed at predetermined regions on the upper surface of the support member 21, which includes the upper surface of each of the internal wirings 22n and 22p. The electrodes for external connection 23n and 23p can be formed in a manner similar to the method of forming the n-side electrode 13 and the p-side electrode 15 described above. Further, the electrodes for external connection 23n and 23p can be formed to have a greater thickness by performing electroless plating after sputtering. In the case where the internal wirings 22n and 22p are made of a material other than Au, for example, Cu or Al, in order to improve adhesion, and in order to improve adhesion to the support member 21, it is preferable to form an Ni film as the first layer 23a (see FIG. 3), which is the lowermost layer, before forming an Au film.

Next, in the step of removing the growth substrate, i.e., the step of removing the substrate (S109), as shown in FIG. 8B, the growth substrate 11 is removed by peeling the growth substrate 11 off from the semiconductor stacked-layer body 12 and the oxide layer 16 by using an LLO method. In the boundary region 12c, the first layer 16a (see FIG. 3), which is the lowermost layer of the oxide layer 16, serves as the separation layer, but a portion of the first layer 16a is left as the lowermost layer of the oxide layer 16 after the growth substrate 11 is peeled off.

Further, as a step after peeling off the growth substrate 11, the exposed lower surface of the semiconductor stacked-layer body 12 may be polished, and roughened by, for example, wet etching to create irregular shapes. By forming the irregular shapes on the back surface of the semiconductor stacked-layer body 12, the light extraction efficiency can be improved.

Next, in the step of forming the wavelength conversion layer (S110), as shown in FIG. 9A, the wavelength conversion layer 3 is formed on the entire lower surface of the wafer 101. The wavelength conversion layer 3 can be formed by, for example, applying a slurry made of a solvent that contains a resin and phosphor particles by spraying the slurry on the lower surface of the wafer 101 and then curing.

Next, in the step of removing the wavelength conversion layer (S111), as shown in FIG. 9B, the adhesive sheet 50 is attached to the lower surface of the wavelength conversion layer 3 and then peeled off. Thus, the wavelength conversion layer 3 at the boundary region 12c is removed from the support member 21. In the present embodiment, the boundary region 12c is the region that includes the outer peripheral region 10 (see FIGS. 1B and 10B) of the completed light emitting device 100. Note that, in place of peeling off by the use of the adhesive sheet 50, removal of the wavelength conversion layer 3 at the boundary region 12c can be performed by, for example, picking with tweezers, or blowing off through the use of an airflow (blow).

The materials of the interfaces between the layers are selected so that the adhesion strength between the layers satisfy the relationships below: "The adhesion strength between the support member 21 and the n-side electrode 13" is smaller than "the adhesion strength between the n-side electrode 13 and the oxide layer 16", "the adhesion strength between the oxide layer 16 and the wavelength conversion layer 3", and "the adhesion strength between the wavelength conversion layer 3 and the sheet 50". Note that "the adhesion strength between the semiconductor stacked-layer body 12 and the wavelength conversion layer 3" is greater than "the adhesion strength between the wavelength conversion layer 3 and the sheet 50", and the region having the semiconductor stacked-layer body 12 is wider than the boundary region 12c. Therefore, peeling off of the sheet 50 will not invite peeling in the region having the semiconductor stacked-layer body 12.

Under such conditions, by attaching the sheet 50 to the wavelength conversion layer 3 and then peeling off therefrom, peeling takes place at "the interface between the support member 21 and the n-side electrode 13" where the adhesion strength is the smallest. Accordingly, with the sheet 50, portions of the n-side electrode 13, the oxide layer 16, and the wavelength conversion layer 3 that are in the boundary region 12c are removed as the peeled fragment 60 from the support member 21. A state in which the n-side electrode 13, the oxide layer 16, and the wavelength conversion layer 3 are removed from the boundary region 12c by peeling off the sheet 50 from the wafer 101, as shown in FIG. 10A.

The sheet 50 may be a heat-resistant sheet having an adhesive applied to its one surface, or a UV exposure sheet whose adhesion can be eliminated by exposing to UV. Also, at the time of attaching the sheet 50 to the wavelength conversion layer 3, the sheet 50 may be vacuum-contacted by using a laminator.

Thereafter, in the step of singulating (S112), as shown in FIG. 10B, by dicing the support member 21 along the boundary line 40, the light emitting device 100 is singulated. The support member 21 left at the boundary region 12c after dicing becomes the outer peripheral region 10 of the light emitting device 100. According to the foregoing steps, the light emitting device 100 shown in FIGS. 1A to 3 is completed.

Second Representative Embodiment

Figure 11:
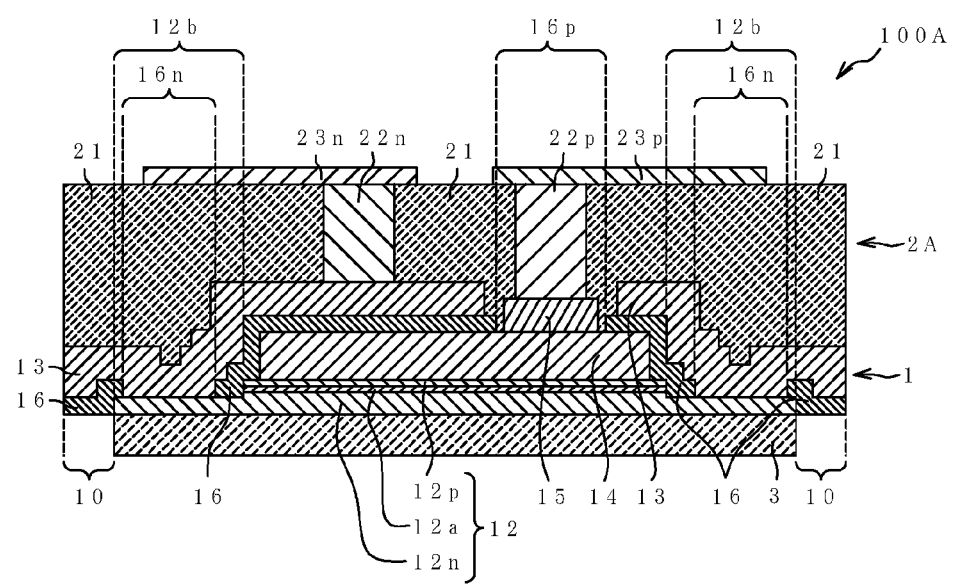
FIG. 11 is a schematic cross-sectional view showing a structure of a light emitting device according to a second embodiment of the present invention.
Figure 12:
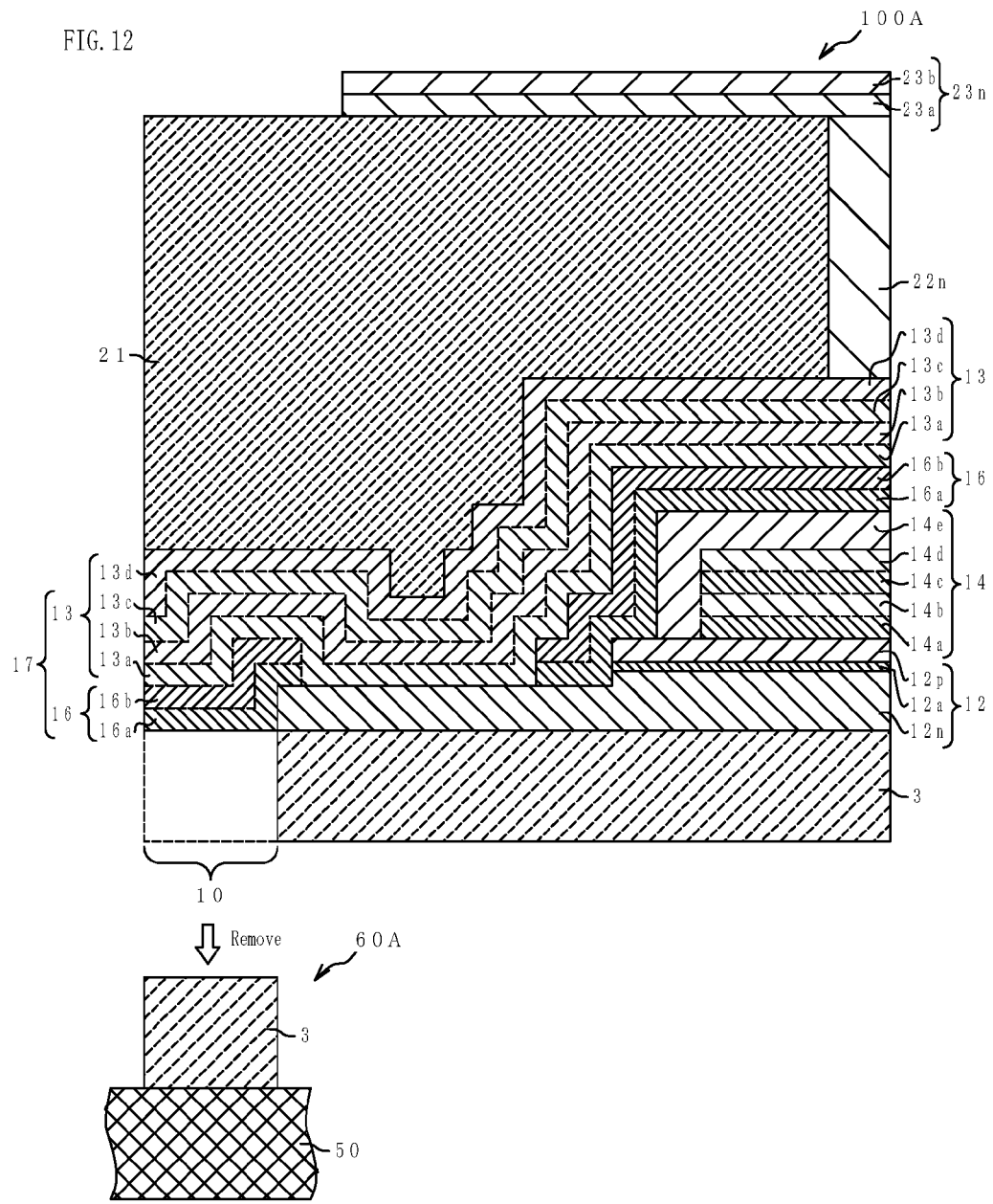
FIG. 12 is an enlarged schematic cross-sectional view showing a detailed structure of a light emitting device according to the second embodiment of the present invention.

Next, with reference to FIGS. 11 and 12, a light emitting device according to a second embodiment will be described. As shown in FIGS. 11 and 12, a light emitting device 100A according to the second embodiment is different from the light emitting device 100 according to the first embodiment shown in FIGS. 1A to 3 in that a base member 2A is included in place of the base member 2. The structures similar to those of the light emitting device 100 according to the first embodiment are denoted by identical reference marks and the description thereof will not be repeated.

The base member 2A according to the second embodiment is different from the base member 2 according to the first embodiment in that the n-side electrode 13 and the oxide layer 16 are provided at the lower surface of the support member 21 at the outer peripheral region 10. The base member 2A is provided with the n-side electrode 13 and the oxide layer 16 at the lower surface of the support member 21 and not provided with the wavelength conversion layer 3 at the outer peripheral region 10. The light emitting device 100A including the base member 2A of such a structure can be manufactured by the procedure similar to that of the first embodiment by employing the materials such as those shown below as the n-side electrode 13 and the oxide layer 16, which are the separation layer 17.

Relative Magnitudes of Adhesion Strengths Between Layers $$a<b,\ a<c,\ a<d \tag{3}$$

In formula (3), either an adhesion "c" between the support member 21 and the n-side electrode 13 or an adhesion "b" between the n-side electrode 13 and the oxide layer 16 may be set strictly greater than the other.

As shown in FIG. 12, in the light emitting device 100A according to the second embodiment, the materials of the layers are selected so that the relative magnitudes of the adhesion strengths between the layers satisfies formula (3) such that the interface between the oxide layer 16 and the wavelength conversion layer 3 becomes the separation interface and the wavelength conversion layer 3 is removed as a peeled fragment 60A.

Next, an example of the material structure of the n-side electrode 13 and the oxide layer 16 will be described. In the case of forming the fourth layer 13d, which is an uppermost layer of the n-side electrode 13, with a metal such as Ni, Al (including an Al alloy), Ti or the like, high adhesion can be obtained between the fourth layer 13d and the support member 21 made of the above-described resin material. Further, in the case where the second layer 16b, which is the uppermost layer of the oxide layer 16, is made of $SiO_2$, $TiO_2$, $Nb_2O_5$, $Al_2O_3$ or the like, which is an insulating oxide, and the first layer 13a, which is the lowermost layer of the n-side electrode 13, is made of a metal such as Ni, Al, Ti, Cr, W or the like, high adhesion can be obtained between them. Still further, in the case where the first layer 16a, which is the lowermost layer of the oxide layer 16, is made of $SiO_2$, $TiO_2$, $Nb_2O_5$, $Al_2O_3$ or the like, which is an insulating oxide, the adhesion to the wavelength conversion layer 3 made of the above-described resin material becomes relatively small.

The adhesion between the above-described resin material and the above-described metal, such as Ni, and the adhesion between the above-described insulating oxide, such as $SiO_2$, and the above-described metal, such as Al, are similar in magnitude. On the other hand, as compared to those adhesions, the adhesion between the above-described insulating oxide, such as $SiO_2$, and the above-described resin material is strictly small. Accordingly, by employing the above-described materials, the adhesion between the oxide layer 16 and the wavelength conversion layer 3 becomes relatively smallest. Thus, at the outer peripheral region 10, peeling takes place at the interface between the oxide layer 16 and the wavelength conversion layer 3, and the wavelength conversion layer 3 is removed by the sheet 50 as the peeled fragment 60A.

In the removing a growth substrate (S109) (see FIG. 4), the first layer 16a of the oxide layer 16 is preferably made of $Nb_2O_5$, so as to be the layer that separates at the outer peripheral region 10 when the growth substrate 11 is removed using an LLO method.

The operation of the light emitting device 100A is similar to that of the light emitting device 100 according to the first embodiment, so description thereof will not be repeated. The light emitting device 100A is provided with the n-side electrode 13, which has light-reflecting properties, and the oxide layer 16, which has light transmissivity, at the lower surface of the support member 21 in the outer peripheral region 10, so that the returning light reflected by an external reflection plate or the like can be efficiently reflected toward the emission direction.

Further, the method of manufacturing the light emitting device 100A can be performed in a similar manner as the method of manufacturing the light emitting device according to the first embodiment, except that the n-side electrode 13 and the oxide layer 16 are formed by the above-described materials, so a detailed description thereof will not be repeated.

Third Representative Embodiment

Figure 13:
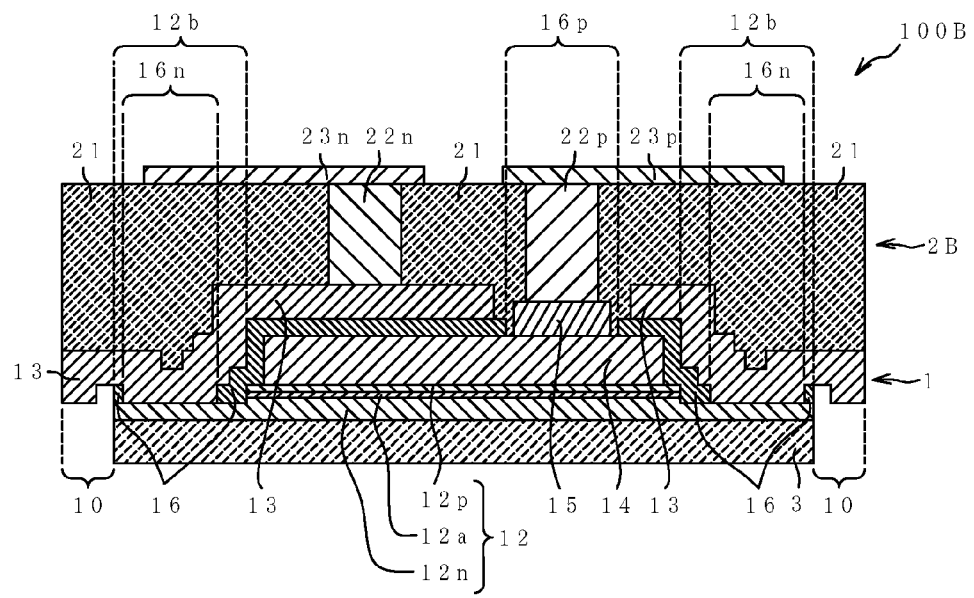
FIG. 13 is a schematic cross-sectional view showing a structure of a light emitting device according to a third embodiment of the present invention.

Next, with reference to FIGS. 13 and 14, a light emitting device according to a third embodiment will be described. As shown in FIGS. 13 and 14, a light emitting device 100B according to the third embodiment is different from the light emitting device 100 according to the first embodiment shown in FIGS. 1A to 3 in that a base member 2B is included in place of the base member 2. The structures similar to those of the light emitting device 100 according to the first embodiment are denoted by identical reference marks and the description thereof will not be repeated.

The base member 2B according to the third embodiment is different from the base member 2 according to the first embodiment in that the n-side electrode 13 is provided at the lower surface of the support member 21 at the outer peripheral region 10. Note that the base member 2B is provided with the n-side electrode 13 at the lower surface of the support member 21 and not provided with the oxide layer 16 and the wavelength conversion layer 3 at the outer peripheral region 10. Further, in the third embodiment, as shown in FIG. 14, at the outer peripheral region 10 before removal of the wavelength conversion layer 3, an oxide layer 16B is provided with a third layer 16c as the top layer is formed.

The light emitting device 100B having the base member 2B can be manufactured in a similar manner as in the first embodiment using the materials shown below as the n-side electrode 13 and the oxide layer 16B, which are the separation layer 17B.

Relative Magnitudes of Adhesion Strengths Between Layers $$a>b, \ b<c, \ b<d \qquad (4)$$

In formula (4), either an adhesion strength "c" between the support member 21 and the n-side electrode 13 and the adhesion strength "a" between the oxide layer 16B and the wavelength conversion layer 3 may be set strictly greater than the other. In formula (4), "a" indicates the adhesion between the oxide layer 16B and the wavelength conversion layer 3, and "b" indicates the adhesion between the n-side electrode 13 and the oxide layer 16B.

As shown in FIG. 14, in the light emitting device 100B according to the third embodiment, the relative magnitudes of the adhesion strengths between the layers satisfies formula (4) so that the interface between the n-side electrode 13 and the oxide layer 16B serves as the separation interface, and a peeled fragment 60B that includes a stacked layer of the oxide layer 16B and the wavelength conversion layer 3 is removed.

Next, an example of the material structure of the n-side electrode 13 and the oxide layer 16B will be described. Similar to the second embodiment, forming the fourth layer 13d, which is the uppermost layer of the n-side electrode 13, with a metal such as Ni, Al (including an Al alloy), Ti or the like, allows for good adhesion to be obtained between the fourth layer 13d and the support member 21 made of the above-described resin material. Further, forming the first layer 16a, which is the lowermost layer of the oxide layer 16B, with an insulating oxide, such as $SiO_2$, $TiO_2$, $Nb_2O_5$, $Al_2O_3$, allows good adhesion to be obtained between the first layer 16a and the wavelength conversion layer 3 made of the above-described resin material. Still further, forming the third layer 16c, which is the uppermost layer of the oxide layer 16, with an electrically conductive oxide, such as ITO, in the case where the first layer 13a, which is the lowermost layer of the n-side electrode 13, is made of a metal such as Ni, Al, Ti, Cr, W or the like, particularly Al, the adhesion between the layers becomes small.

Note that the oxide layer 16 provided on the semiconductor stacked-layer body 12 must have a function of electrically separating the n-side electrode 13 and the p-type semiconductor layer 12p from each other. Accordingly, when the second layer 16b is made of an electrically conductive oxide such as ITO, short-circuiting may occur. Accordingly, in the third embodiment, in the step of forming the oxide layer (S104) (see FIG. 4), the oxide layer 16 made up of the first layer 16a and the second layer 16b is formed in a manner similar to the first embodiment. Then, the third layer 16c is formed using an electrically conductive oxide, such as ITO, as the top layer only on the boundary region 12c (see FIG. 6A).

As shown in FIG. 14, at the outer peripheral region 10, when the third layer 16c, being the top layer of the oxide layer 16B, is made of ITO, which is an electrically conductive oxide and the first layer 13a, being the lowest layer of the n-side electrode 13, is made of metal such as Ni, Al, Ti, Cr, W or the like, the adhesion between the layers becomes relatively small. Accordingly, by employing the above-described material structure, the adhesion between the oxide layer 16B and the n-side electrode 13 becomes relatively the smallest at the outer peripheral region 10. Thus, the interface between the oxide layer 16B and the n-side electrode 13 becomes the separation interface.

Since the operation of the light emitting device 100B is similar to that of the light emitting device 100 according to the first embodiment, a description thereof is not repeated. Note that, since the light emitting device 100B has the n-side electrode 13 having light-reflecting properties at the lower surface of the support member 21 at the outer peripheral region 10, the returning light reflected by an external reflection plate or the like can be efficiently reflected toward the output direction.

Further, since the method of manufacturing the light emitting device 100B can be performed by a procedure similar to that of the method of manufacturing the light emitting device according to the first embodiment, except that the n-side electrode 13 and the oxide layer 16B are formed by the above-described materials and the third layer 16c of the oxide layer 16B is formed at the outer peripheral region 10 as described above, a detailed description thereof is not repeated.

In the foregoing, though the method of manufacturing the light emitting device of the present invention has been described specifically based on the embodiments for carrying out the invention, the gist of the present invention is not limited thereto, and should be broadly construed based on the scope of claims. Further, it goes without saying that the gist of the present invention includes various changes and modifications based on the description.

What is claimed is:

1. A method of manufacturing a light emitting device comprising:
   providing a wafer having a substrate and a plurality of semiconductor stacked-layer bodies stacked on the substrate, an upper surface of the substrate being exposed at an outer peripheral region of each of the plurality of semiconductor stack bodies in a plan view;
   forming a separation layer integrally covering the upper surface of the substrate and an upper surface of the semiconductor stacked-layer body, the separation layer including a separation boundary;
   forming a support member on the separation layer;
   removing the substrate;
   forming a wavelength conversion layer on a side of the semiconductor stack body and the separation layer where the substrate is removed, the wavelength conversion layer made of a resin containing a wavelength conversion member; and
   removing the wavelength conversion layer located in the outer peripheral region by separating the separation layer at the separation boundary.

2. The method of manufacturing a light emitting device according to claim 1, wherein the step of removing the wavelength conversion layer further comprises attaching an adhesive sheet to a surface of the wavelength conversion layer which is at an opposite side of a surface in contact with the semiconductor stacked-layer body, and peeling the adhesive sheet to remove the wavelength conversion layer located at the outer peripheral region.

3. The method of manufacturing a light emitting device according to claim 2, wherein an adhesion between the support member and the separation layer is smaller than an adhesion between the separation layer and the wavelength conversion layer, and in the step of removing the wavelength conversion layer, peeling occurs at an interface between the separation layer and the support member to remove the wavelength conversion layer located at the outer peripheral region.

4. The method of manufacturing a light emitting device according to claim 3, wherein the support member is made of a resin, and the separation layer includes a layer being in contact with the support member at the outer peripheral region, the layer being made of one of Au and a platinum metal.

5. The method of manufacturing a light emitting device according to claim 4, wherein the support member is made of a resin, the resin of the support member and the resin of the wavelength conversion layer are each selected from the group consisting of a silicone resin, a modified silicone resin, an epoxy resin, a modified epoxy resin, a urea resin, a phenolic resin, an acrylate resin, a urethane resin, a fluororesin, and a hybrid resin containing at least one of those resins.

6. The method of manufacturing a light emitting device according to claim 2, wherein the support member is made of a resin, and the separation layer includes a layer being in contact with the support member at the outer peripheral region, the layer being made of one of Au and a platinum metal.

7. The method of manufacturing a light emitting device according to claim 6, wherein the support member is made of a resin, the resin of the support member and the resin of the wavelength conversion layer are each selected from the group consisting of a silicone resin, a modified silicone resin, an epoxy resin, a modified epoxy resin, a urea resin, a phenolic resin, an acrylate resin, a urethane resin, a fluororesin, and a hybrid resin containing at least one of those resins.

8. The method of manufacturing a light emitting device according to claim 2, wherein an adhesion between the separation layer and the wavelength conversion layer is smaller than an adhesion between the support member and the separation layer, and in the step of removing the wavelength conversion layer, the wavelength conversion layer located at the outer peripheral region is removed by peeling at an interface between the separation layer and the wavelength conversion layer.

9. The method of manufacturing a light emitting device according to claim 8, wherein the support member is made of a resin, and the separation layer includes a first layer being in contact with the wavelength conversion layer at the outer peripheral region, the first layer being made of $Nb_2O_5$, the separation layer further including a second layer being in contact with the support member at the outer peripheral region, the second layer being made of one of Ni, Ti, Al and an alloy whose main component is Al.

10. The method of manufacturing a light emitting device according to claim 9, wherein the support member is made of a resin, the resin of the support member and the resin of the wavelength conversion layer are each selected from the group consisting of a silicone resin, a modified silicone resin, an epoxy resin, a modified epoxy resin, a urea resin, a phenolic resin, an acrylate resin, a urethane resin, a fluororesin, and a hybrid resin containing at least one of those resins.

11. The method of manufacturing a light emitting device according to claim 2, wherein the support member is made of a resin, and the separation layer includes a first layer being in contact with the wavelength conversion layer at the outer peripheral region, the first layer being made of $Nb_2O_5$, the separation layer further including a second layer being in contact with the support member at the outer peripheral region, the second layer being made of one of Ni, Ti, Al and an alloy whose main component is Al.

12. The method of manufacturing a light emitting device according to claim 11, wherein the support member is made of a resin, the resin of the support member and the resin of the wavelength conversion layer are each selected from the group consisting of a silicone resin, a modified silicone resin, an epoxy resin, a modified epoxy resin, a urea resin, a phenolic resin, an acrylate resin, a urethane resin, a fluororesin, and a hybrid resin containing at least one of those resins.

13. The method of manufacturing a light emitting device according to claim 2, wherein in the step of forming the separation layer, the separation layer is formed by stacking an oxide layer and a metal layer in order from the upper surface side of the substrate, wherein an adhesion between the metal layer and the oxide layer is smaller than an adhesion between the support member and the metal layer and an adhesion between the oxide layer and the wavelength conversion layer, and in the step of removing the wavelength conversion layer, the wavelength conversion layer located at the outer peripheral region is removed by peeling at an interface between the oxide layer and the metal layer.

14. The method of manufacturing a light emitting device according to claim 13, wherein the support member is made of a resin, the oxide layer includes a layer being in contact with the metal layer at the outer peripheral region, the layer being made of indium tin oxide, and the metal layer includes a first layer being in contact with the support member at the outer peripheral region, the first layer being made of one of Ni, Ti, Al and an alloy whose main component is Al, the metal layer further including a second layer being in contact with the oxide layer at the outer peripheral region, the second layer being made of one of Al and an alloy whose main component is Al.

15. The method of manufacturing a light emitting device according to claim 14, wherein the support member is made of a resin, the resin of the support member and the resin of the wavelength conversion layer are each selected from the group consisting of a silicone resin, a modified silicone resin, an epoxy resin, a modified epoxy resin, a urea resin, a phenolic resin, an acrylate resin, a urethane resin, a fluororesin, and a hybrid resin containing at least one of those resins.

16. The method of manufacturing a light emitting device according to claim 2, wherein in the step of removing the substrate, the substrate is removed using a laser lift-off method.

17. The method of manufacturing a light emitting device according to claim 2, wherein in the step of removing the wavelength conversion layer, the wavelength conversion layer is removed such that a side surface of the semiconductor stacked-layer body and a side surface of the wavelength conversion layer are substantially flush with each other.

18. The method of manufacturing a light emitting device according to claim 1, wherein the support member is made of a resin, the resin of the support member and the resin of the wavelength conversion layer are each selected from the group consisting of a silicone resin, a modified silicone resin, an epoxy resin, a modified epoxy resin, a urea resin, a phenolic resin, an acrylate resin, a urethane resin, a fluororesin, and a hybrid resin containing at least one of those resins.

19. The method of manufacturing a light emitting device according to claim 1, wherein in the step of removing the substrate, the substrate is removed using a laser lift-off method.

20. The method of manufacturing a light emitting device according to claim 1, wherein in the step of removing the wavelength conversion layer, the wavelength conversion layer is removed such that a side surface of the semiconductor stacked-layer body and a side surface of the wavelength conversion layer are substantially flush with each other.

* * * * *